United States Patent
Kawashima et al.

(10) Patent No.: US 11,244,880 B2
(45) Date of Patent: Feb. 8, 2022

(54) SEMICONDUCTOR DEVICE

(71) Applicant: DENSO CORPORATION, Kariya (JP)

(72) Inventors: Takanori Kawashima, Anjo (JP); Takuya Kadoguchi, Toyota (JP); Kohji Uramoto, Toyota (JP); Yasuhiro Ogawa, Toyota (JP)

(73) Assignee: DENSO CORPORATION, Kariya (JP)

(*) Notice: Subject to any disclaimer, the term of this patent is extended or adjusted under 35 U.S.C. 154(b) by 12 days.

(21) Appl. No.: 16/839,635

(22) Filed: Apr. 3, 2020

(65) Prior Publication Data
US 2020/0365498 A1 Nov. 19, 2020

(30) Foreign Application Priority Data
May 15, 2019 (JP) .............................. JP2019-092411

(51) Int. Cl.
*H01L 23/31* (2006.01)
*H01L 23/498* (2006.01)
*H01L 21/48* (2006.01)

(52) U.S. Cl.
CPC ...... *H01L 23/3142* (2013.01); *H01L 21/4825* (2013.01); *H01L 23/3114* (2013.01); *H01L 23/49805* (2013.01); *H01L 23/49861* (2013.01)

(58) Field of Classification Search
CPC ............. H01L 21/4825; H01L 23/3142; H01L 23/3114; H01L 23/49861; H01L 23/49805; H01L 2224/27013; H01L 2224/03013; H01L 2224/02245; H01L 2224/02175; H01L 2224/26175

See application file for complete search history.

(56) References Cited

U.S. PATENT DOCUMENTS

| 10,147,671 | B2* | 12/2018 | Hayashi | H01L 23/49575 |
| 2016/0343630 | A1* | 11/2016 | Kadoguchi | H01L 23/4952 |
| 2017/0278774 | A1 | 9/2017 | Hayashi et al. | |
| 2017/0311445 | A1* | 10/2017 | Chang | H01L 23/13 |
| 2017/0352629 | A1* | 12/2017 | Fukumoto | H01L 24/40 |

FOREIGN PATENT DOCUMENTS

| JP | 2009-146950 A | 7/2009 |
| JP | 2016-197706 A | 11/2016 |

* cited by examiner

*Primary Examiner* — Zandrav V Smith
*Assistant Examiner* — Abbigale A Boyle
(74) *Attorney, Agent, or Firm* — Sughrue Mion, PLLC

(57) ABSTRACT

A semiconductor device may be provided with: a semiconductor chip; an encapsulant encapsulating the semiconductor chip therein; and a conductor member joined to the semiconductor chip via a solder layer within the encapsulant. The conductor member may comprise a joint surface in contact with the solder layer and a side surface extending from a peripheral edge of the joint surface. The side surface may comprise an unroughened area and a roughened area that is greater in surface roughness than the unroughened area. The unroughened area may be located adjacent to the peripheral edge of the joint surface.

7 Claims, 14 Drawing Sheets

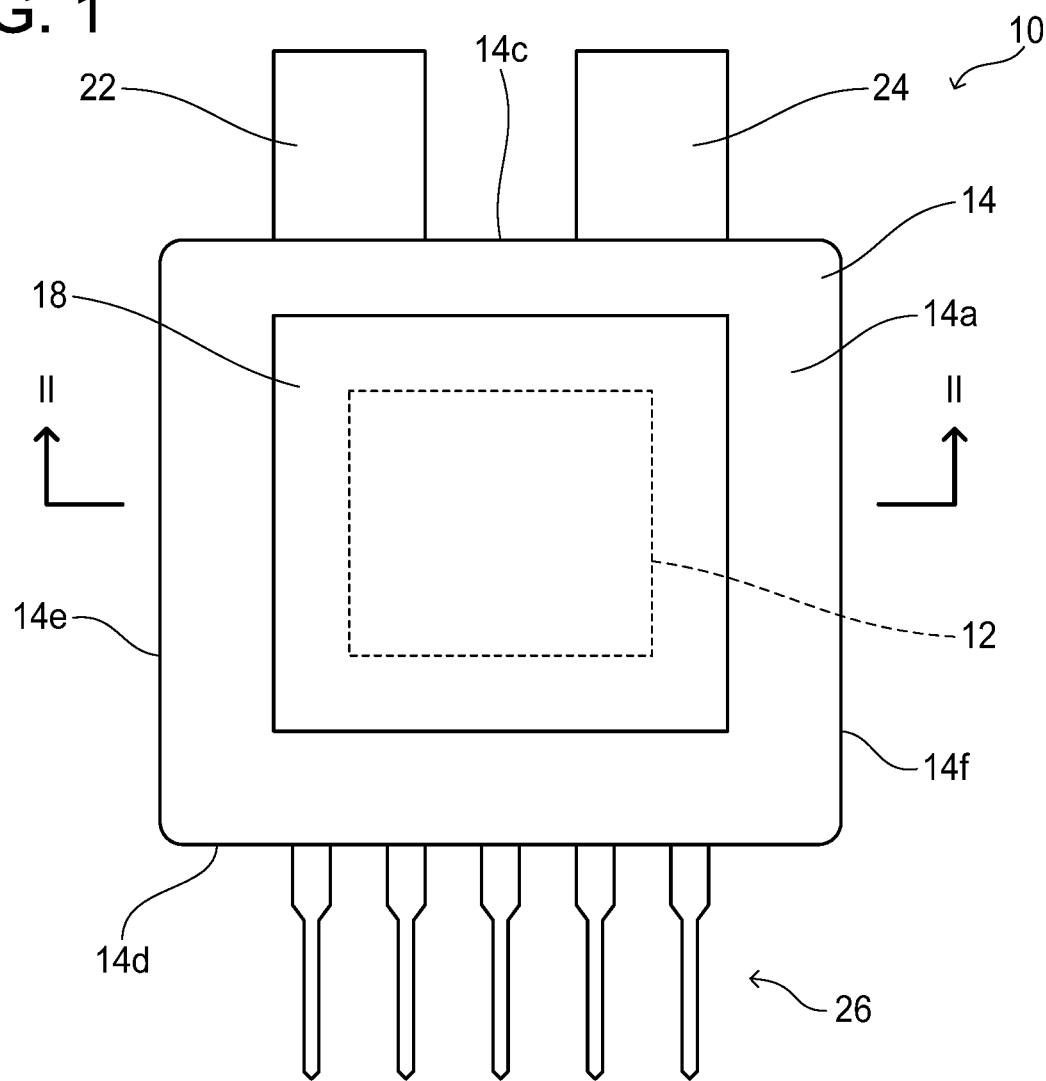
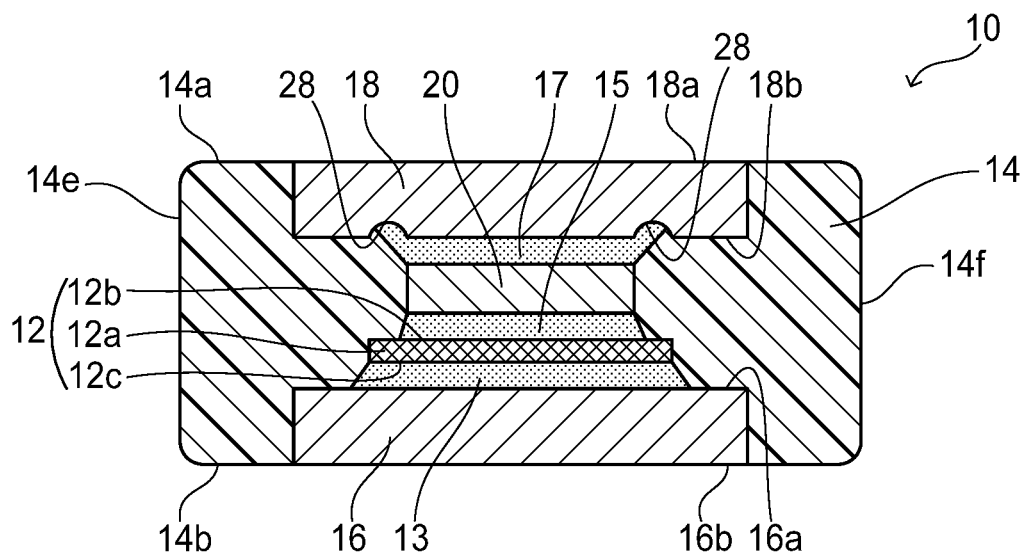

SEMICONDUCTOR DEVICE

CROSS-REFERENCE TO RELATED APPLICATION(S)

This application claims priority to Japanese Patent Application No. 2019-092411, filed on May 15, 2019, the entire contents of which are incorporated herein by reference.

TECHNICAL FIELD

The art disclosed herein relates to a semiconductor device.

BACKGROUND

Japanese Patent Application Publication No. 2009-146950 describes a semiconductor device. This semiconductor device is provided with a semiconductor chip, an encapsulant encapsulating the semiconductor chip therein, and a conductor member joined to the semiconductor chip within the encapsulant. The semiconductor chip and the conductor member are joined by a solder layer.

SUMMARY

When a semiconductor chip and a conductor member are soldered together, excessive solder may overflow from between the semiconductor chip and the conductor member. If the excessive solder spreads toward the semiconductor chip in such a circumstance, there is a risk of occurrence of defects such as short circuiting and insufficient insulation in the semiconductor chip. Due to this, it is preferable for the excessive solder to spread over the conductor member. However, if a surface of the conductor member is broadly covered by the solder, an adhering degree between the conductor member and an encapsulant may decrease, by which durability of a semiconductor device may be degraded, for example. The description herein provides an art configured to suppress such a circumstance from occurring and improve durability of a semiconductor device.

A semiconductor device disclosed herein may comprise: a semiconductor chip; an encapsulant encapsulating the semiconductor chip therein; and a conductor member joined to the semiconductor chip via a solder layer within the encapsulant. The conductor member comprises a joint surface being in contact with the solder layer and a side surface extending from a peripheral edge of the joint surface. The side surface comprises an unroughened area and a roughened area that is greater in surface roughness than the unroughened area. Further, the unroughened area is located adjacent to the peripheral edge of the joint surface.

With the aforementioned semiconductor device, the roughened area and the unroughened area are provided on the side surface of the conductor member. Since the roughened area has large surface roughness, its solder wettability is low. As such, when the semiconductor chip and the conductor member are soldered together, excessive solder primarily spreads on the unroughened area while on the other hand it is suppressed from spreading onto the roughened area. According to this, the surface of the conductor member is suppressed from being broadly covered by the solder, and durability of the semiconductor device can thereby be improved. In addition, since the roughened area not covered by the solder has the large surface roughness, it can firmly adhere to the encapsulant. With an adhering degree between the conductor member and the encapsulant being improved, the durability of the semiconductor device is further improved.

BRIEF DESCRIPTION OF DRAWINGS

FIG. 1 is a plan view showing an outer appearance of a semiconductor device 10 of a first embodiment.

FIG. 2 is a cross-sectional view along a line II-II in FIG. 1.

DETAILED DESCRIPTION

Figure 3:
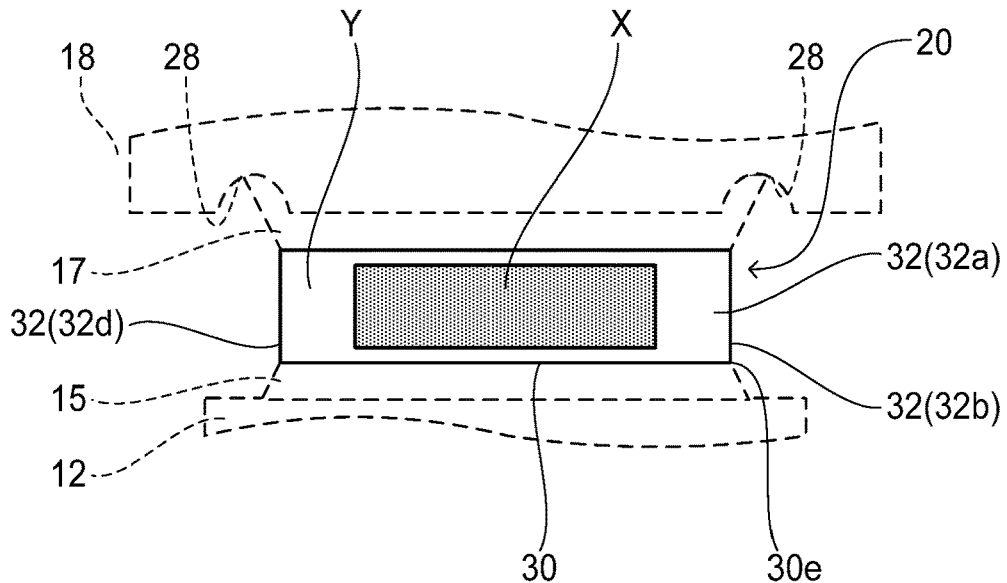
FIG. 3 shows a side surface 32 of a conductor spacer 20.

According to an aspect of the art disclosed herein, an unroughened area may be in contact with a peripheral edge of a joint surface. According to such a configuration, excessive solder having overflowed from the joint surface can be spread smoothly onto the unroughened area of a side surface.

According to an aspect of the art disclosed herein, a roughened area may be located apart from the peripheral edge of the joint surface. According to such a configuration, spreading of the excessive solder can be suppressed from being overly restricted by the roughened area.

According to an aspect of the art disclosed herein, a conductor member may comprise a plate-shaped portion and a protruding portion protruding from a surface of the plate-shaped portion. Further, the joint surface and the side surface as aforementioned may be located on the protruding portion. A specific shape of the conductor member is not particularly limited.

In the aforementioned configuration, the surface of the plate-shaped portion may comprise a groove extending around the protruding portion. In this case, the unroughened area may extend from the peripheral edge of the joint surface to the groove. According to such a configuration, the excessive solder having overflowed from the joint surface is guided to the groove over the unroughened area of the side surface. With the excessive solder being contained in the groove, excessive spreading of the solder can be suppressed.

According to an aspect of the art disclosed herein, the aforementioned side surface may slope outwardly in a direction separating away from the joint surface. According to such a configuration, a greater amount of the excessive solder can be dealt with by increasing an area of the side surface while maintaining an area of the joint surface.

According to an aspect of the art disclosed herein, the aforementioned side surface may comprise a plurality of flat surfaces located along the peripheral edge of the joint surface and a plurality of corners each located between a corresponding pair of adjacent flat surfaces of the plurality of flat surfaces. In this case, at least two of the plurality of flat surfaces may each comprise the roughened area. In other words, at least one of the plurality of flat surfaces may not comprise the roughened area. Alternatively, all of the plurality of flat surfaces may each comprise the roughened area. Further, at least one of the plurality of flat surfaces may comprise two or more roughened areas.

In the aforementioned configuration, the roughened area may be located apart from each of the corners. In this case, the excessive solder spreads over the corner(s) of the side surfaces. In a vicinity of each corner of the side surface, stress caused by thermal deformation is relatively small. Due to this, damage (fatigue) imposed on the solder can be reduced by receiving the excessive solder in such a region. However, as another configuration, the roughened area may be located in a region including at least one of the corners.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

A semiconductor device 10 of a first embodiment will be described with reference to FIGS. 1 to 4. The semiconductor device 10 of the present embodiment is employed in a power controller of an electric vehicle, for example, and may constitute a part of a power converter circuit such as a converter or an inverter. The electric vehicle described herein broadly refers to vehicles including a motor configured to drive a wheel, and may include an electric vehicle configured to be charged by external power, a hybrid vehicle including an engine in addition to a motor, and a fuel cell vehicle that uses a fuel cell as its power source.

As shown in FIGS. 1 and 2, the semiconductor device 10 includes a semiconductor chip 12 and an encapsulant 14 that encapsulates the semiconductor chip 12. The encapsulant 14 is constituted of an insulative material. Although not particularly limited, the encapsulant 14 of the present embodiment is constituted of an encapsulating material such as epoxy resin. The encapsulant 14 has a substantially plate-like shape, and includes an upper surface 14a, a lower surface 14b, a first end surface 14c, a second end surface 14d, a first side surface 14e, and a second side surface 14f.

The semiconductor chip 12 is a power semiconductor chip, and includes a semiconductor substrate 12a, an upper surface electrode 12b, and a lower surface electrode 12c. The upper surface electrode 12b is located on an upper surface of the semiconductor substrate 12a and the lower surface electrode 12c is located on a lower surface of the semiconductor substrate 12a. The upper surface electrode 12b and the lower surface electrode 12c are electrically connected to each other through the semiconductor substrate 12a. Although not particularly limited, the semiconductor chip 12 in the present embodiment is a switching element, and is configured to selectively switch the upper surface electrode 12b and the lower surface electrode 12c between an electrically conducted state and an electrically cut-off state. A type of the semiconductor substrate 12a is not particularly limited. The semiconductor substrate 12a may for example be a silicon substrate, a silicon carbide substrate, or a nitride semiconductor substrate. The upper surface electrode 12b and the lower surface electrode 12c may be configured by using one or more types of metals such as aluminum, nickel, and gold.

Although this is merely an example, the semiconductor chip 12 of the present embodiment is a RC (Reverse Conducting)-IGBT in which an Insulated Gate Bipolar Transistor (IGBT) and a diode are integrally configured. The upper surface electrode 12b is connected to an emitter of the IGBT and an anode of the diode and the lower surface electrode 12c is connected to a collector of the IGBT and a cathode of the diode. In another embodiment, the semiconductor chip 12 may be a Metal-Oxide-Semiconductor Field-Effect Transistor (MOSFET). In this case, the upper surface electrode 12b is connected to a source of the MOSFET and the lower surface electrode 12c is connected to a drain of the MOSFET.

The semiconductor device 10 further includes a first conductor plate 16 and a second conductor plate 18. The first conductor plate 16 and the second conductor plate 18 face each other with the semiconductor chip 12 interposed therebetween. The first conductor plate 16 and the second conductor plate 18 are constituted of a conductor such as metal. Although this is merely an example, each of the first conductor plate 16 and the second conductor plate 18 of the present embodiment is constituted of copper and have a nickel plating coating its surface. The first conductor plate 16 and the second conductor plate 18 are retained by the encapsulant 14, and face each other with the semiconductor chip 12 interposed therebetween. An upper surface 16a of the first conductor plate 16 is located within the encapsulant 14 and is electrically connected to the lower surface electrode 12c of the semiconductor chip 12. A lower surface 16b of the first conductor plate 16 is exposed on the lower surface 14b of the encapsulant 14. Due to this, the first conductor plate 16 can constitute a part of a circuit electrically connected to the semiconductor chip 12 and further function as a heat dissipating plate for dissipating heat from the semiconductor chip 12 to outside. The upper surface 16a of the first conductor plate 16 and the lower surface electrode 12c of the semiconductor chip 12 are joined by soldering, and a solder layer 13 is provided between the first conductor plate 16 and the semiconductor chip 12.

Similarly, a lower surface 18b of the second conductor plate 18 is located within the encapsulant 14 and is electrically connected to the upper surface electrode 12b of the semiconductor chip 12. However, a conductor spacer 20 is interposed between the lower surface 18b of the second conductor plate 18 and the upper surface electrode 12b of the semiconductor chip 12. The conductor spacer 20 is constituted of a conductor such as metal. Although this is merely an example, the conductor spacer 20 of the present embodiment is constituted of copper and has a nickel plating coating its surface. An upper surface 18a of the second conductor plate 18 is exposed on the upper surface 14a of the encapsulant 14. Due to this, the second conductor plate 18 can also constitute a part of the circuit electrically connected to the semiconductor chip 12 and further function as a heat dissipating plate for dissipating heat from the semiconductor chip 12 to outside. The conductor spacer 20 and the upper surface electrode 12b of the semiconductor chip 12 are joined by soldering, and a solder layer 15 is provided between the conductor spacer 20 and the semiconductor chip 12. Further, the lower surface 18b of the second conductor plate 18 and the conductor spacer 20 are also joined by soldering, and a solder layer 17 is provided between the second conductor plate 18 and the conductor spacer 20. Further, a groove 28 is provided on the lower surface 18b of the second conductor plate 18 along a peripheral edge of the solder layer 17. The groove 28 is provided for receiving excessive solder generated in the soldering of the second conductor plate 18 and the conductor spacer 20 and in the soldering of the conductor spacer 20 and the semiconductor chip 12.

The semiconductor device 10 comprises a first power terminal 22, a second power terminal 24, and a plurality of signal terminals 26. The first power terminal 22 and the second power terminal 24 protrude out from the first end surface 14c of the encapsulant 14. The first power terminal 22 is electrically connected to the first conductor plate 16 within the encapsulant 14, and the second power terminal 24 is electrically connected to the second conductor plate 18 within the encapsulant 14. Due to this, the first power terminal 22 and the second power terminal 24 are electrically connected through the semiconductor chip 12. The plurality of signal terminals 26 protrudes out from the second end surface 14d of the encapsulant 14. Each of the signal terminals 26 is electrically connected to a signal pad (not shown) of the semiconductor chip 12.

Figure 4:
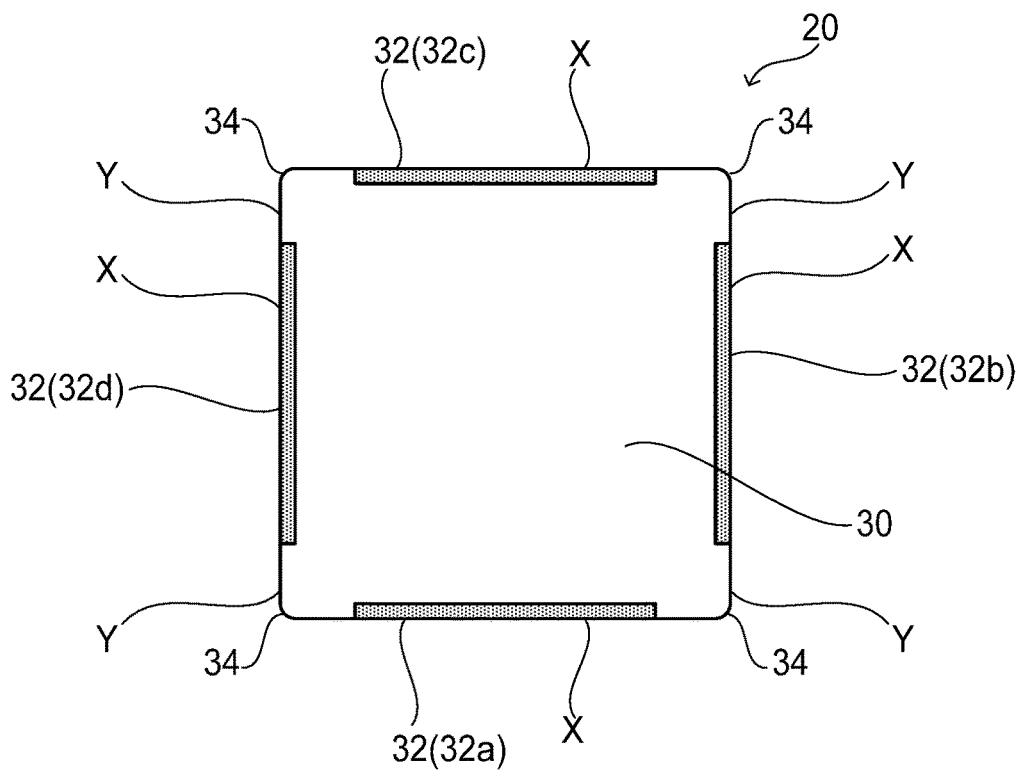
FIG. 4 shows a joint surface 30 of the conductor spacer 20.
Figure 5:
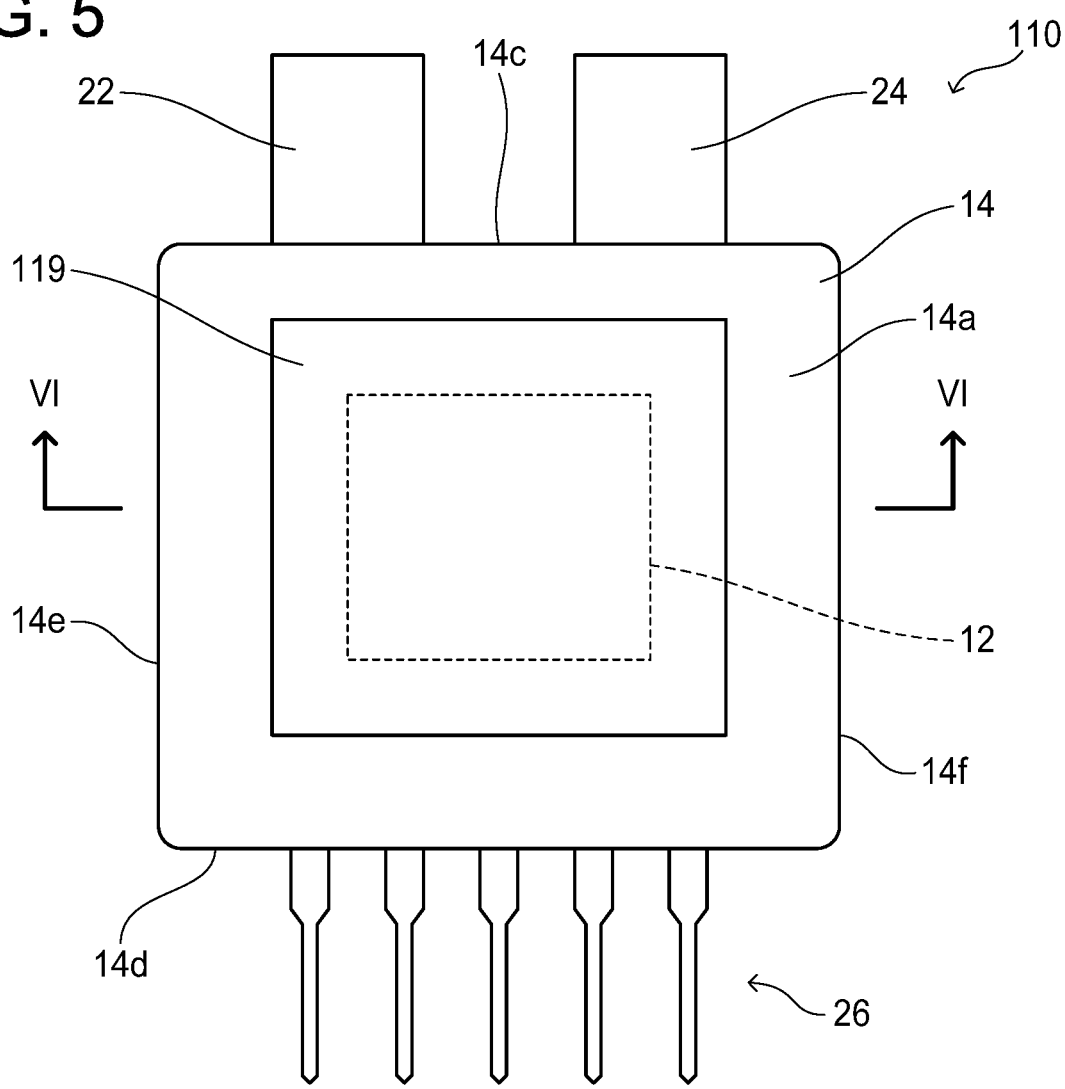
FIG. 5 is a plan view showing an outer appearance of a semiconductor device 110 of a second embodiment.
Figure 6:
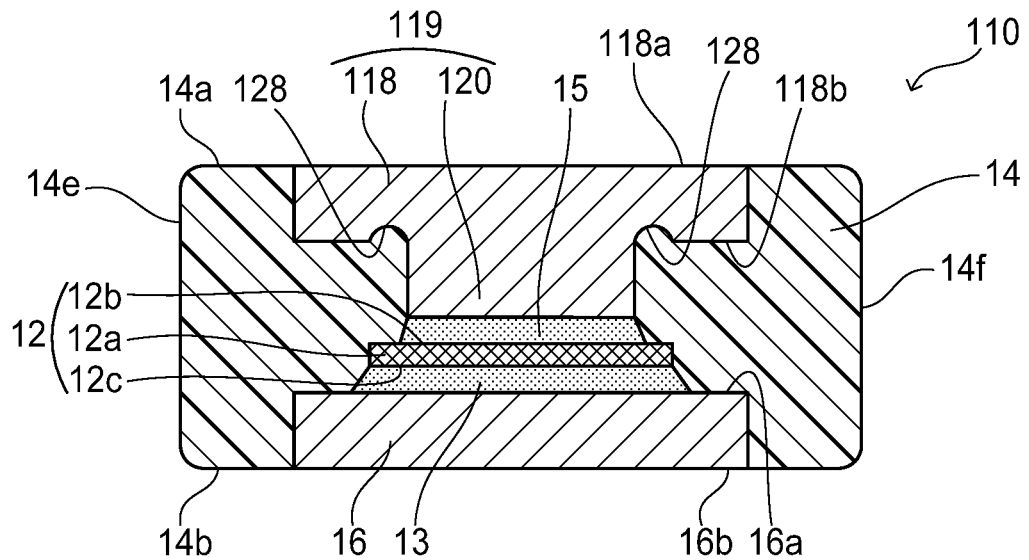
FIG. 6 is a cross-sectional view along a line VI-VI in FIG. 5.
Figure 7:
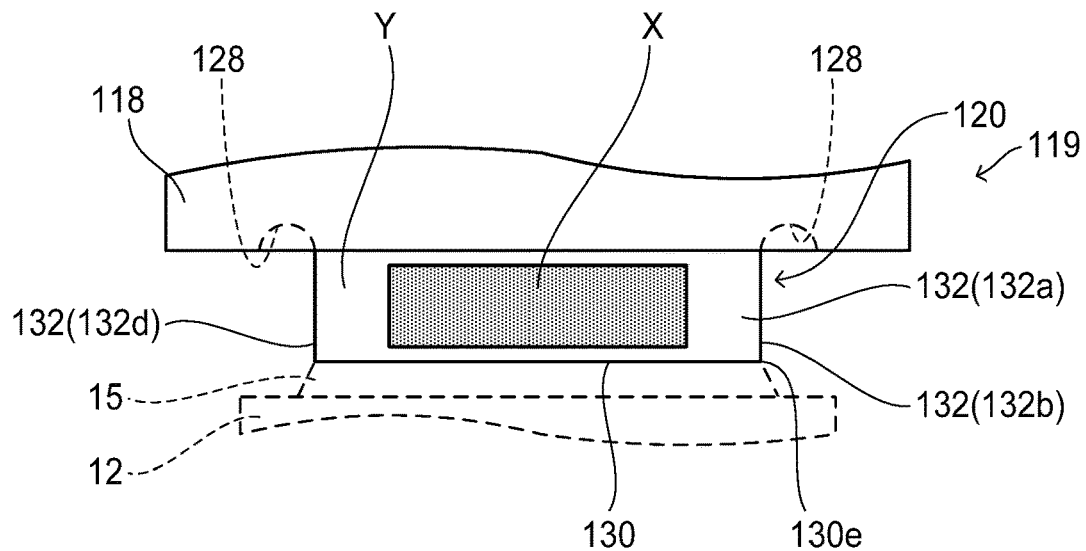
FIG. 7 shows a side surface 132 of a protruding portion 120 of a second conductor plate 119 of the second embodiment.
Figure 8:
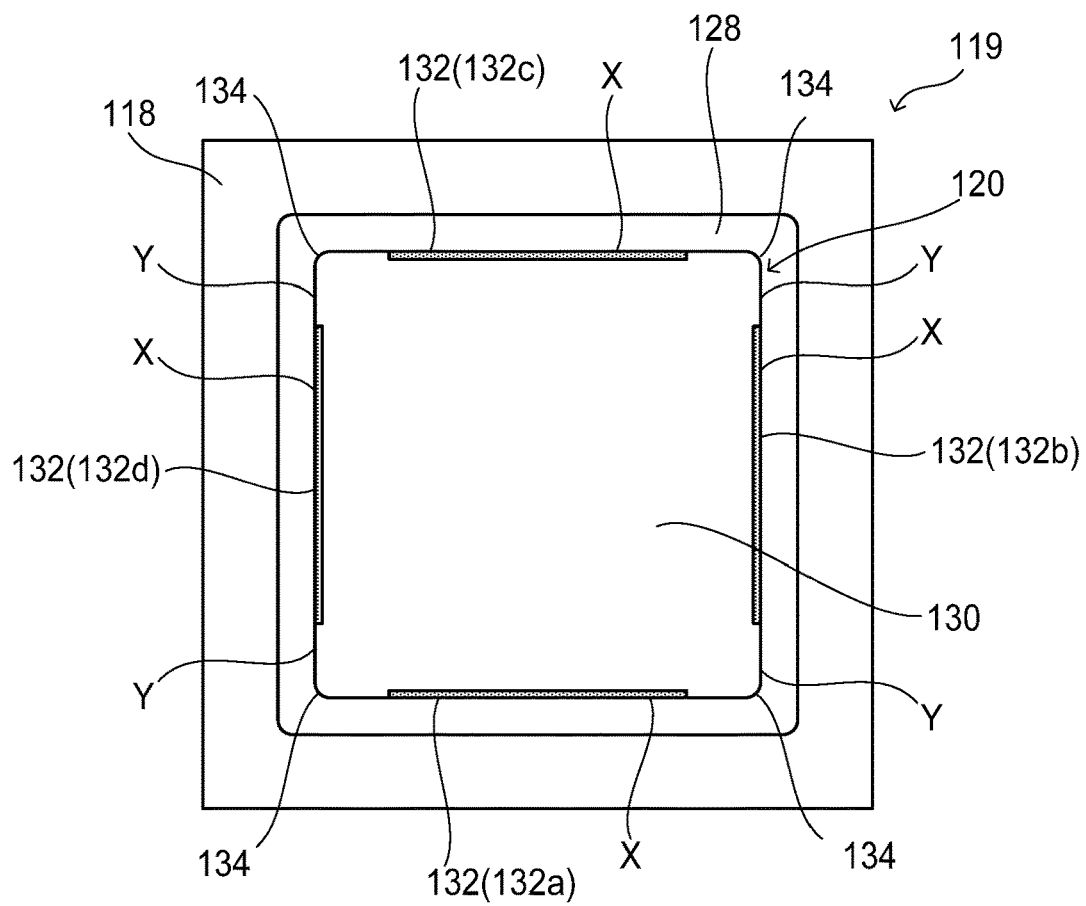
FIG. 8 shows a joint surface 130 of the protruding portion 120 of the second conductor plate 119 of the second embodiment.
Figure 9:
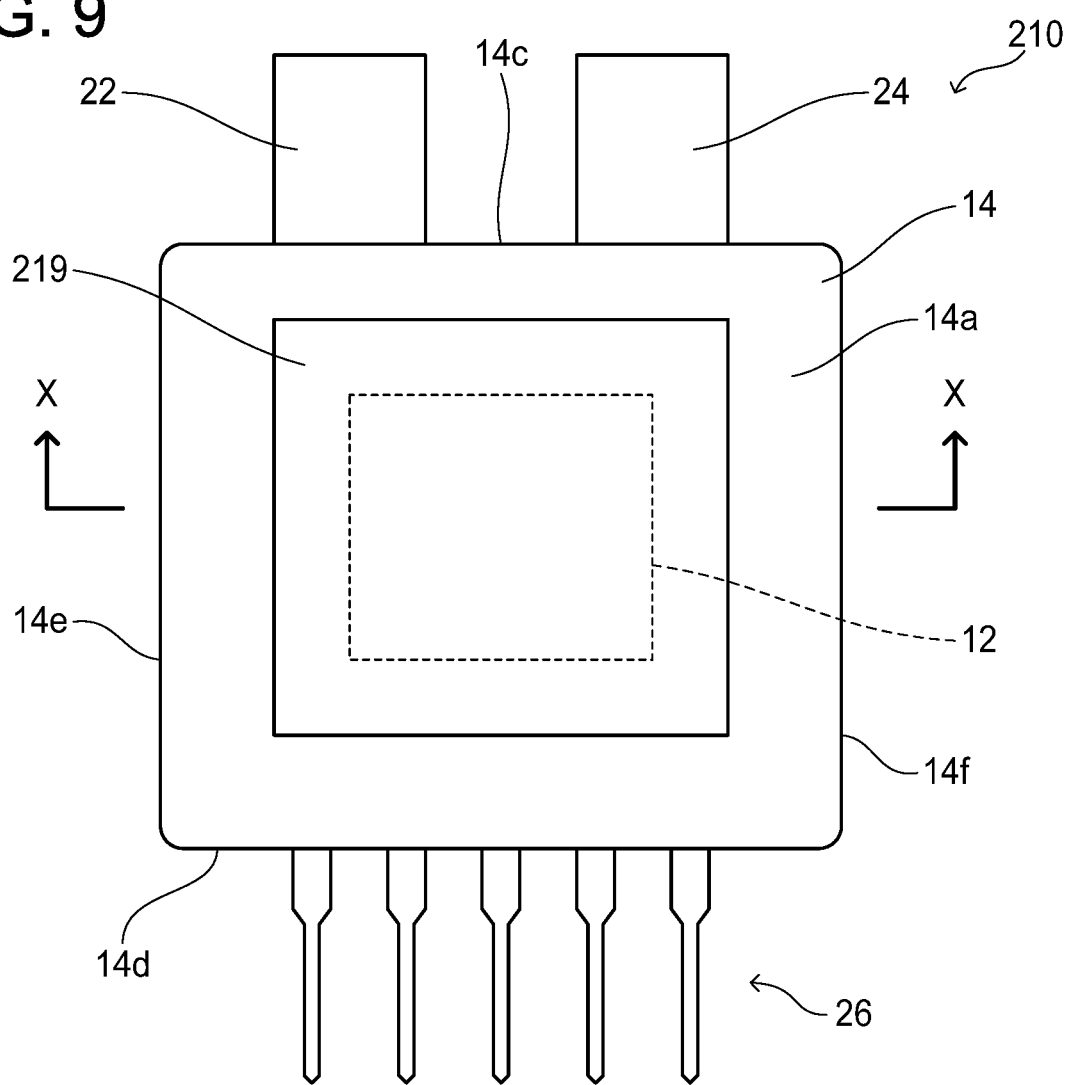
FIG. 9 is a plan view showing an outer appearance of a semiconductor device 210 of a third embodiment.
Figure 10:
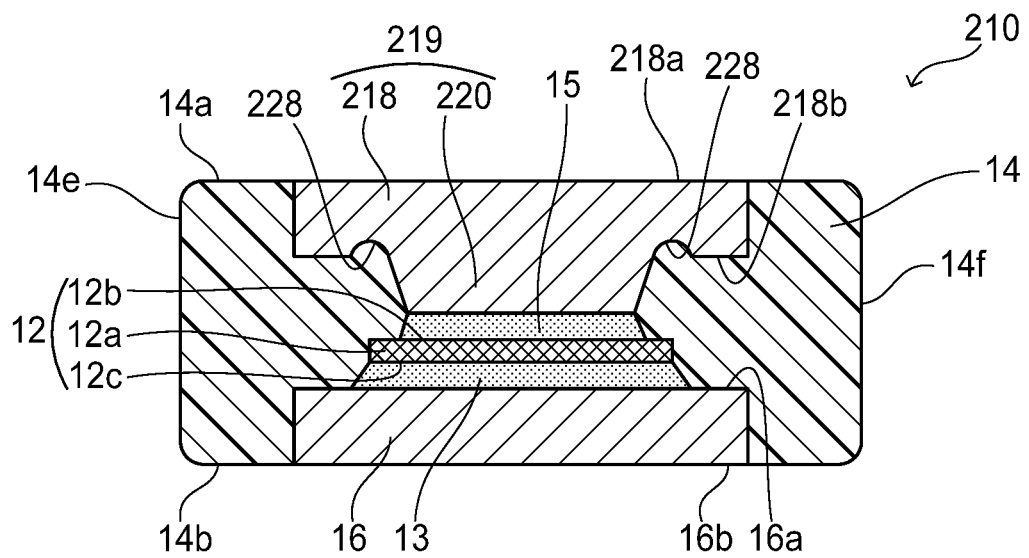
FIG. 10 is a cross-sectional view along a line X-X in FIG. 9.
Figure 11:
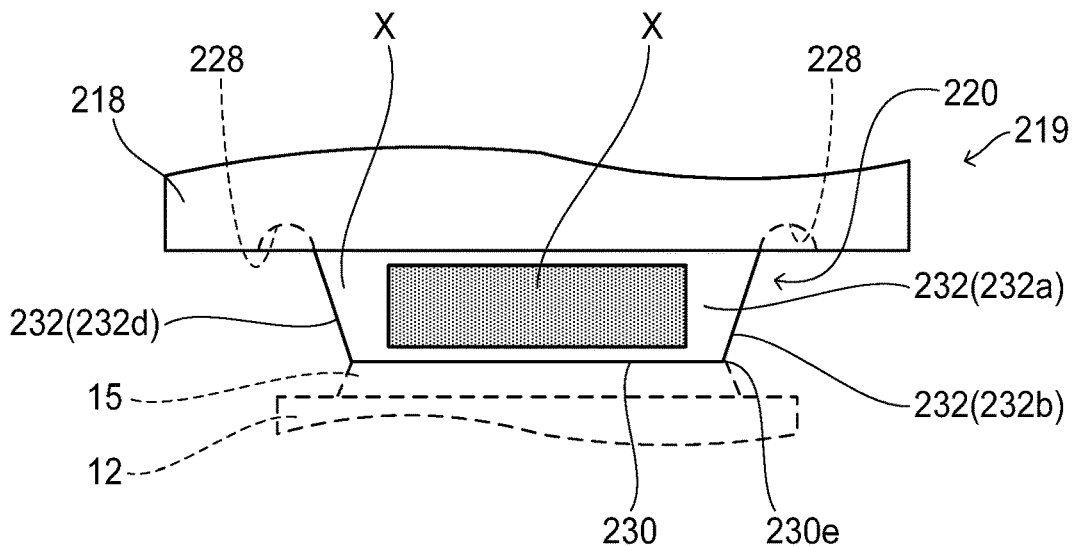
FIG. 11 shows a side surface 232 of a protruding portion 220 of a second conductor plate 219 of the third embodiment.
Figure 12:
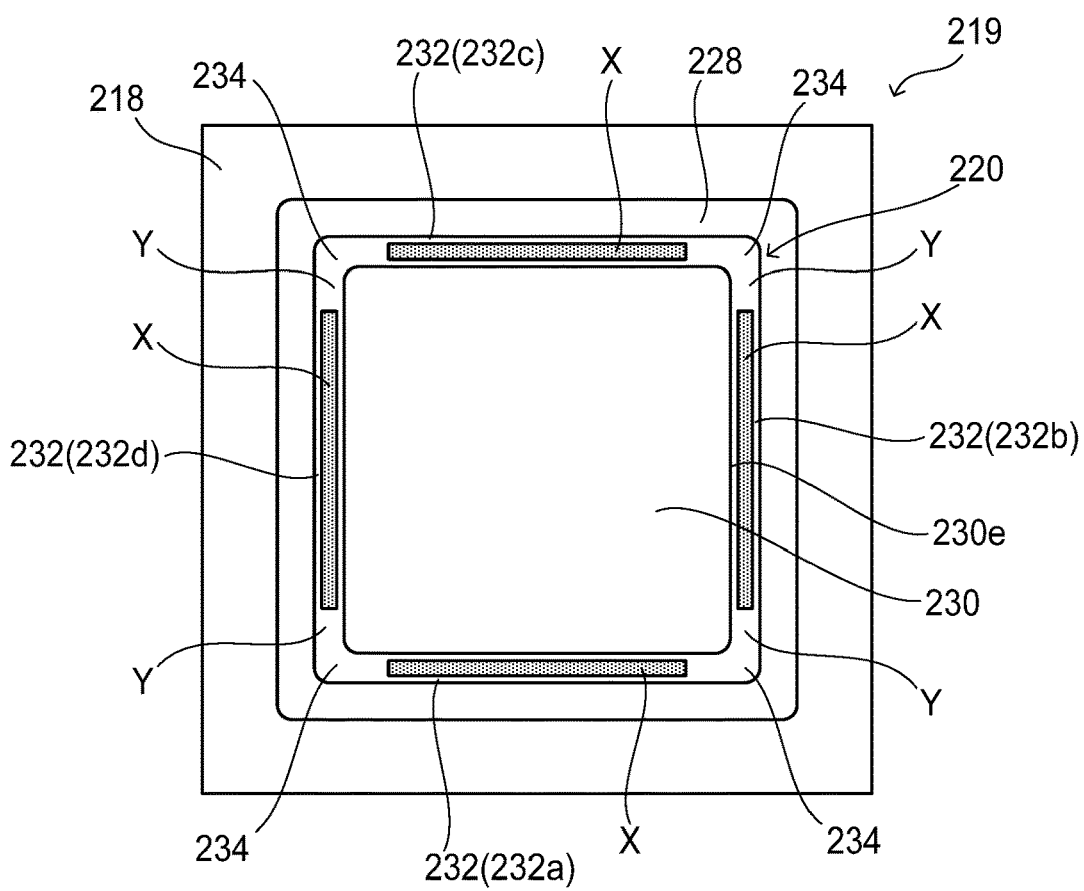
FIG. 12 shows a joint surface 230 of the protruding portion 220 of the second conductor plate 219 of the third embodiment.
Figure 13:
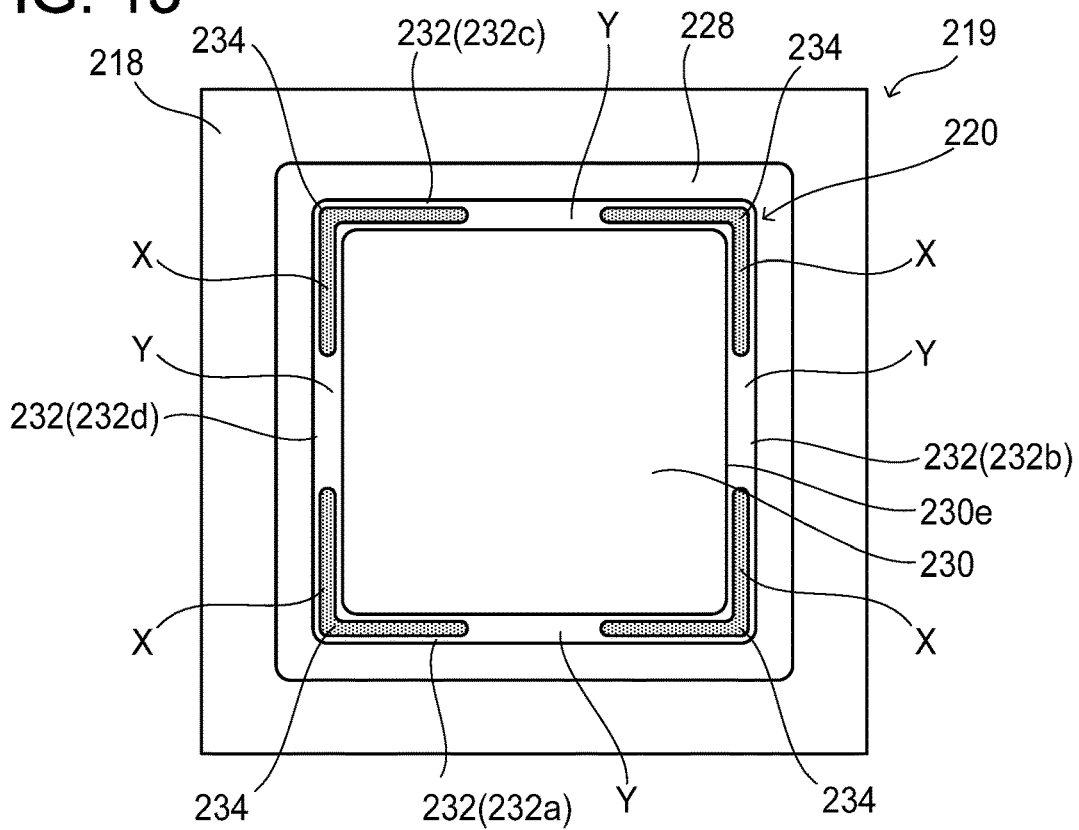
FIG. 13 shows a variant of the semiconductor device 210 of the third embodiment.

As shown in FIGS. 3 and 4, the conductor spacer 20 includes a joint surface 30 in contact with the solder layer 15 and side surfaces 32 extending from a peripheral edge 30e of the joint surface 30. Each side surface 32 of the conductor spacer 20 is provided with a roughened area X and an unroughened area Y. In the roughened area X, a surface of the conductor spacer 20 is roughened to improve an adhering degree with the material constituting the encapsulant 14. As such, a surface roughness of the roughened area X is greater than a surface roughness of the unroughened area Y. Although not particularly limited, the roughened area X is formed by laser irradiation. That is, laser is irradiated to the side surfaces 32 of the conductor spacer 20 to finely vaporize and deposit the metal constituting the side surfaces 32 (which is herein nickel). Although this is merely an example, the conductor spacer 20 of the present embodiment has a plate-like shape, and the side surfaces 32 of the conductor spacer 20 include four flat surfaces 32a, 32b, 32c, 32d and four corners 34. The four flat surfaces 32a, 32b, 32c, 32d are arranged along the peripheral edge 30e of the joint surface 30. Each of the corners 34 is located between a corresponding pair of adjacent flat surfaces among the four flat surfaces 32a, 32b, 32c, 32d. The roughened area X is provided on each of the four flat surfaces 32a, 32b, 32c, 32d. Each of those roughened areas X is located apart from the corners 34, and each of regions including the corners 34 is configured as the unroughened area Y. A method of forming the roughened areas X (that is, a roughening method) is not limited to the laser irradiation, and may be carried out by other methods such as forming grooves or dimples, for example.

With the aforementioned configuration, when the semiconductor device 10 is to be manufactured, the semiconductor chip 12 and the conductor spacer 20 need to be soldered together. In this soldering, excessive solder may overflow from between the semiconductor chip 12 and the conductor spacer 20. In this case, if the excessive solder spreads toward the semiconductor chip 12, there is a risk that short circuiting and insufficient insulation occur in the semiconductor chip 12. Contrary to this, if the excessive solder spreads over the side surfaces 32 of the conductor spacer 20, the short circuiting and insufficient insulation in the semiconductor chip 12 can be avoided. However, when the side surfaces 32 of the conductor spacer 20 are broadly covered by the solder, there is a risk that an adhering degree between the conductor spacer 20 and the encapsulant 14 decreases. In regard to this point, the semiconductor device 10 of the present embodiment provides the roughened areas X and the unroughened areas Y on the side surfaces 32 of the conductor spacer 20. The roughened areas X have the large surface roughness, thus their solder wettability is low. As such, when the semiconductor chip 12 and the conductor spacer 20 are soldered together, the excessive solder spreads primarily on the unroughened areas Y, and is suppressed from spreading onto the roughened areas X. Due to this, the side surfaces 32 of the conductor spacer 20 are suppressed from being broadly covered by the solder. In addition, since the roughened areas X not covered by the solder have the large surface roughness, they can firmly adhere to the encapsulant 14. With the adhering degree between the conductor member 20 and the encapsulant 14 being improved, durability of the semiconductor device 10 is evidently improved.

In the semiconductor device 10 of the present embodiment, the unroughened areas Y are provided adjacent to the peripheral edge 30e of the joint surface 30. According to such a configuration, the excessive solder having overflowed from the joint surface 30 can smoothly spread onto the unroughened areas Y of the side surfaces 32. Due to this, spreading of the excessive solder toward the semiconductor chip 12 can effectively be suppressed. In addition, the roughened areas X are located apart from the peripheral edge 30e of the joint surface 30. According to such a configuration, the spreading of the excessive solder can be suppressed from being overly restricted by the roughened areas X.

In the semiconductor device 10 of the present embodiment, the unroughened areas Y extend from the solder layer 15 located on one side of the conductor spacer 20 to the solder layer 17 located on the other side of the conductor spacer 20. According to such a configuration, the two solder layers 15, 17 can be connected via the unroughened areas Y of the conductor spacer 20, and excessiveness or insufficiency of the solder can be complemented between the two solder layers 15, 17. Due to this, a thickness of each of the solder layers 15, 17 can be designed relatively small, for example.

Second Embodiment

A semiconductor device 110 of a second embodiment will be described with reference to FIGS. 5 to 8. The semiconductor device 110 of the present embodiment does not have the conductor spacer 20 and has a different shape of a second conductor plate 119, and differs from the semiconductor device 10 of the first embodiment in these points. On the other hand, other configurations of the semiconductor device 110 of the present embodiment are same as those of the semiconductor device 10 of the first embodiment. In FIGS. 5 to 8, same reference signs as the semiconductor device 10 of the first embodiment are given to the configurations that are same as those of the semiconductor device 10 of the first embodiment, and redundant explanations therefor will be omitted.

The second conductor plate 119 of the present embodiment includes a plate-shaped portion 118 and a protruding portion 120. The plate-shaped portion 118 has a substantially same or similar shape as the second conductor plate 18 of the first embodiment. An upper surface 118a of the plate-shaped portion 118 is exposed on the upper surface 14a of the encapsulant 14, and a lower surface 118b of the plate-shaped portion 118 faces the first conductor plate 16 within the encapsulant 14. The protruding portion 120 protrudes from the lower surface 118b of the plate-shaped portion 118 toward the semiconductor chip 12. The protruding portion 120 is electrically connected to the upper surface electrode 12b of the semiconductor chip 12. The protruding portion 120 and the upper surface electrode 12b of the semiconductor chip 12 are joined by soldering, and the solder layer 15 is provided between the protruding portion 120 and the semiconductor chip 12. Although not particularly limited, the second conductor plate 119 of the present embodiment is also constituted of copper and has a nickel plating coating its surface.

The protruding portion 120 of the second conductor plate 119 includes a joint surface 130 in contact with the solder layer 15 and side surfaces 132 extending from a peripheral edge 130e of the joint surface 130. A roughened area X and an unroughened area Y are provided on each of the side surfaces 132 of the protruding portion 120. A surface roughness of the roughened area X is larger than a surface roughness of the unroughened area Y. In the present embodiment as well, the roughened areas X are formed by the laser irradiation. Although this is merely an example, the protruding portion 120 of the present embodiment has a plate shape, and the side surfaces 132 of the protruding portion 120 include four flat surfaces 132a, 132b, 132c, 132d and four corners 134. This feature is same as the conductor spacer 20 of the first embodiment. The roughened area X is provided in each of the four flat surfaces 132a, 132b, 132c, 132d. Each of those roughened areas X is located apart from the corners 134, and each of regions including the corners 134 is configured as the unroughened area Y.

A groove 128 is provided in the lower surface 118b of the plate-shaped portion 118. The groove 128 extends in a ring shape around the protruding portion 120. The groove 128 is configured to receive excessive solder in soldering of the protruding portion 120 of the second conductor plate 119 and the semiconductor chip 12. That is, the excessive solder having overflowed from between the protruding portion 120 and the semiconductor chip 12 moves to the groove 128 over the side surfaces 132 of the protruding portion 120, and is received in the groove 128

In the semiconductor device 110 of the present embodiment, each side surface 132 of the protruding portion 120 having the joint surface 130 is provided with a roughened area X and an unroughened area Y. Since the roughened areas X have a large surface roughness, their solder wettability is low. As such, when the semiconductor chip 12 and the protruding portion 120 are soldered together, the excessive solder spreads primarily on the unroughened areas Y, and is suppressed from spreading onto the roughened areas X. Due to this, the side surfaces 132 of the protruding portion 120 are suppressed from being broadly covered by the solder. In addition, since the roughened areas X not covered by the solder have the large surface roughness, they can firmly adhere to the encapsulant 14. With an adhering degree between the protruding portion 120 and the encapsulant 14 being improved, durability of the semiconductor device 110 is evidently improved.

In the semiconductor device 110 of the present embodiment as well, the unroughened areas Y are provided adjacent to the peripheral edge 130e of the joint surface 130. According to such a configuration, the excessive solder having overflowed from the joint surface 130 can smoothly spread onto the unroughened areas Y of the side surfaces 132. Due to this, spreading of the excessive solder toward the semiconductor chip 12 can effectively be suppressed. In addition, the roughened areas X are located apart from the peripheral edge 130e of the joint surface 130. According to such a configuration, the spreading of the excessive solder can be suppressed from being overly restricted by the roughened areas X.

Especially in the semiconductor device 110 of the present embodiment, the unroughened areas Y extend from the peripheral edge 130e of the joint surface 130 to the groove 128. According to such a configuration, the excessive solder having overflowed from the joint surface 130 is smoothly guided to the groove 128 over the unroughened areas Y of the side surfaces 132. With the excessive solder being received by the groove 128, excessive spreading of the solder is suppressed on the lower surface 118b of the plate-shaped portion 118 as well.

Third Embodiment

A semiconductor device 210 of a third embodiment will be described with reference to FIGS. 9 to 12. The semiconductor device 210 of the third embodiment has a different shape of a second conductor plate 219 as compared to the semiconductor device 110 of the second embodiment. On the other hand, other configurations of the semiconductor device 210 of the present embodiment are same as those of the semiconductor device 110 of the second embodiment. In FIGS. 9 to 12, same reference signs as the semiconductor device 110 of the second embodiment are given to the configurations that are same as those of the semiconductor device 110 of the second embodiment, and redundant explanations therefor will be omitted.

The second conductor plate 219 of the present embodiment includes a plate-shaped portion 218 and a protruding portion 220. The plate-shaped portion 218 has a substantially same or similar shape as the plate-shaped portion 118 of the second conductor plate 119 in the second embodiment. Similar to the second embodiment, a lower surface 218b of the plate-shaped portion 218 is provided with a groove 228 along the protruding portion 220. The protruding portion 220 is electrically connected to the upper surface electrode 12b of the semiconductor chip 12. The protruding portion 220 and the upper surface electrode 12b of the semiconductor chip 12 are joined by soldering, and the solder layer 15 is provided between the protruding portion 220 and the semiconductor chip 12. Although not particularly limited, the second conductor plate 219 of the present embodiment is also constituted of copper and has a nickel plating coating its surface.

The protruding portion 220 of the second conductor plate 219 includes a joint surface 230 in contact with the solder layer 15 and side surfaces 232 extending from a peripheral edge 230e of the joint surface 230. Here, the protruding portion 220 of the present embodiment has a truncated frustum shape, and the side surfaces 232 thereof slope outwardly in a direction separating away from the joint surface 230. According to such a configuration, a greater amount of excessive solder can be dealt with by increasing areas of the side surfaces 232 while maintaining an area of the joint surface 230.

A roughened area X and an unroughened area Y are provided on each of the side surfaces 232 of the protruding portion 220. A surface roughness of the roughened area X is larger than a surface roughness of the unroughened area Y. Although this is merely an example, the protruding portion 220 of the present embodiment has a truncated square frustum shape, and the side surfaces 232 of the protruding portion 220 include four flat surfaces 232a, 232b, 232c, 232d and four corners 234. A roughened area X is provided in each of the four flat surfaces 232a, 232b, 232c, 232d. Each of those roughened areas X is located apart from the corners 234, and each of regions including the corners 234 is configured as an unroughened area Y.

In the semiconductor device 210 of the present embodiment as well, the roughened areas X and the unroughened areas Y are provided on the side surfaces 232 of the protruding portion 220 having the joint surface 230. Since the roughened areas X have the large surface roughness, their solder wettability is low. As such, when the semiconductor chip 12 and the protruding portion 220 are soldered together, the excessive solder spreads primarily on the unroughened areas Y, and is suppressed from spreading onto the roughened areas X. Due to this, the side surfaces 232 of the protruding portion 220 are suppressed from being broadly covered by the solder. In addition, since the roughened areas X not covered by the solder have the large surface roughness, they can firmly adhere to the encapsulant 14. With an adhering degree between the protruding portion 220 and the encapsulant 14 being improved, durability of the semiconductor device 210 is evidently improved.

In the semiconductor device 210 of the present embodiment as well, the unroughened areas Y are provided adjacent to the peripheral edge 230e of the joint surface 230. According to such a configuration, the excessive solder having overflowed from the joint surface 230 can smoothly spread onto the unroughened areas Y of the side surfaces 232. Due to this, spreading of the excessive solder toward the semiconductor chip 12 can effectively be suppressed. In addition, the roughened areas X are located apart from the peripheral edge 230e of the joint surface 230. According to such a configuration, the spreading of the excessive solder can be suppressed from being overly restricted by the roughened areas X. In addition, the unroughened areas Y extend from the peripheral edge 230e of the joint surface 230 to the groove 228. According to such a configuration, the excessive solder having overflowed from the joint surface 230 is smoothly guided to the groove 228 over the unroughened areas Y of the side surfaces 232. With the excessive solder being received by the groove 228, excessive spreading of the solder is suppressed on the lower surface 218b of the plate-shaped portion 218 as well.

In the semiconductor devices 10, 110, 210 of the aforementioned embodiments, a shape, position, and size of the roughened areas X can freely be modified. As representative examples, variants of the semiconductor device 210 of the third embodiment are shown in FIGS. 13 to 17. In an example shown in FIG. 13, each of the roughened areas X is provided in a region including its corresponding corner 234 of the side surfaces 232, and extends along a corresponding pair of adjacent two among the flat surfaces 232a to 232d. In this variant as well, the unroughened area Y extends from the peripheral edge 230e of the joint surface 230 to the groove 228 in a vicinity of a center of each of the flat surfaces 232a to 232d.

Figure 14:
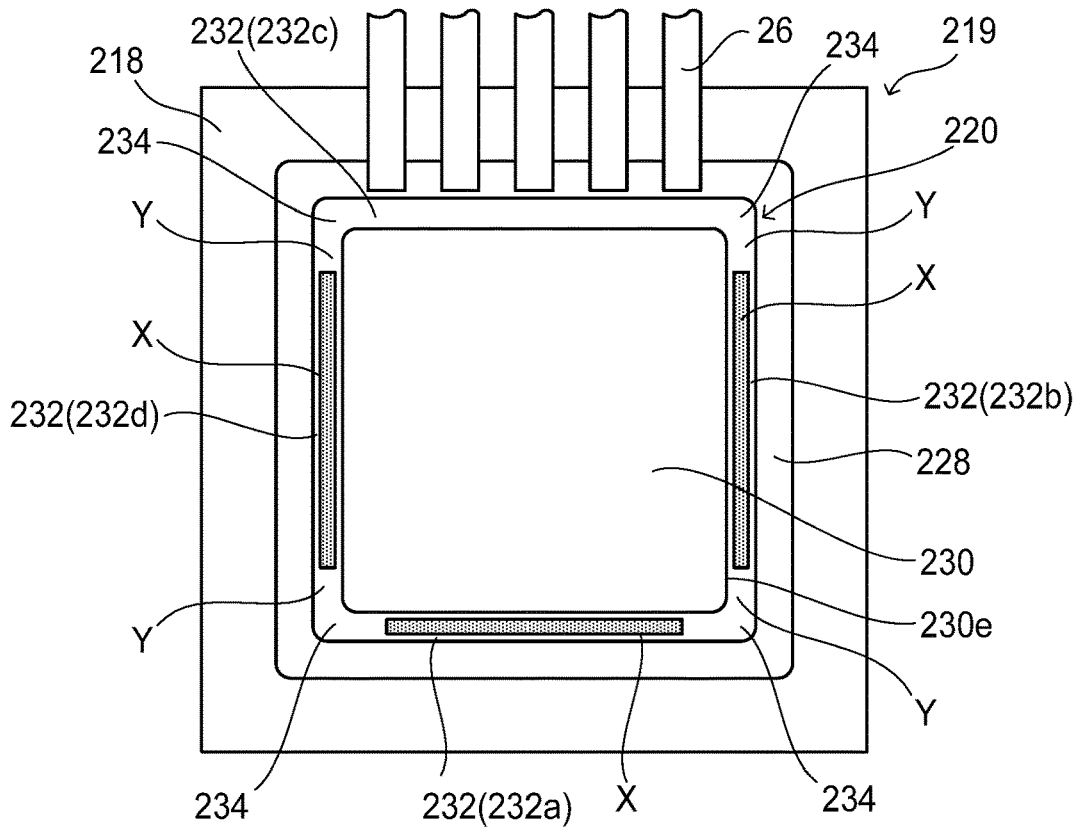
FIG. 14 shows a variant of the semiconductor device 210 of the third embodiment.

In an example shown in FIG. 14, the roughened area X is not provided on one flat surface 232c in a vicinity of the signal terminals 26 among the four flat surfaces 232a to 232d of the side surfaces 232. The one flat surface 232c in a vicinity of the signal terminals 26 is also adjacent to signal pads (not shown) of the semiconductor chip 12. For such a flat surface 232c, it may be preferable to actively guide excessive solder toward a second conductor plate 219 side by not providing the roughened area X (or alternatively, by reducing an occupying ratio of the roughened area X). Due to this, the excessive solder is effectively suppressed from spreading toward the semiconductor chip 12, and a defect such as short-circuiting between the signal pads may be avoided.

Figure 15:
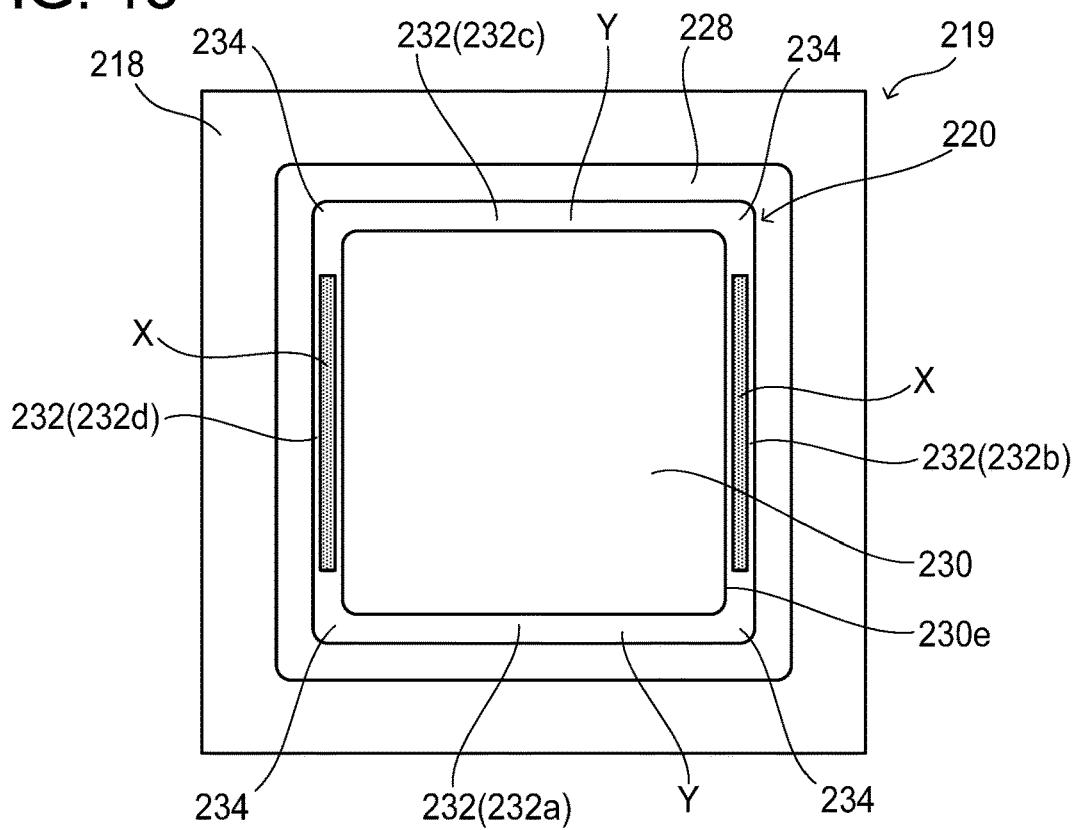
FIG. 15 shows a variant of the semiconductor device 210 of the third embodiment.
Figure 16:
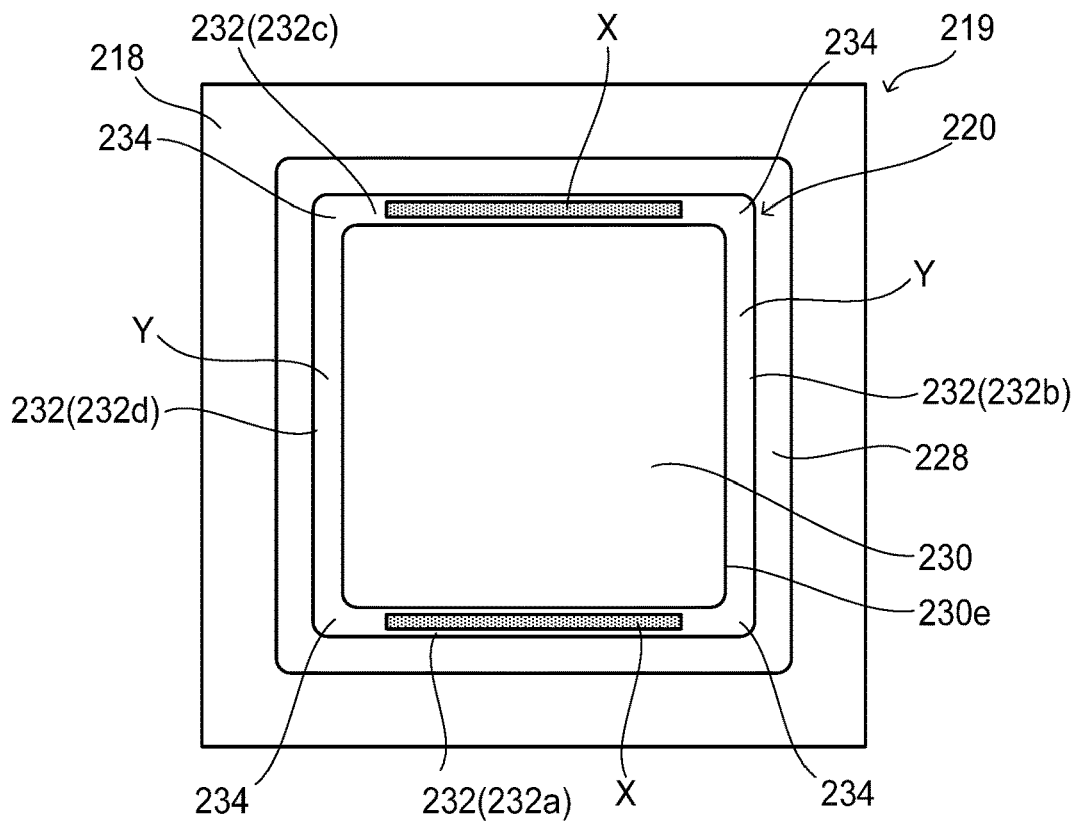
FIG. 16 shows a variant of the semiconductor device 210 of the third embodiment.

In an example shown in FIG. 15, the roughened area X is provided on each of two flat surfaces 232b, 232d located on opposite sides from each other among the four flat surfaces 232a to 232d of the side surfaces 232. In an example shown in FIG. 16 as well, the roughened area X is provided on each of other two flat surfaces 232a, 232c located on opposite sides from each other among the four flat surfaces 232a to 232d of the side surfaces 232. When the side surfaces 232 include such a plurality of flat surfaces 232a to 232d, the roughened area X may be provided on at least one of the plurality of flat surfaces 232a to 232d.

Figure 17:
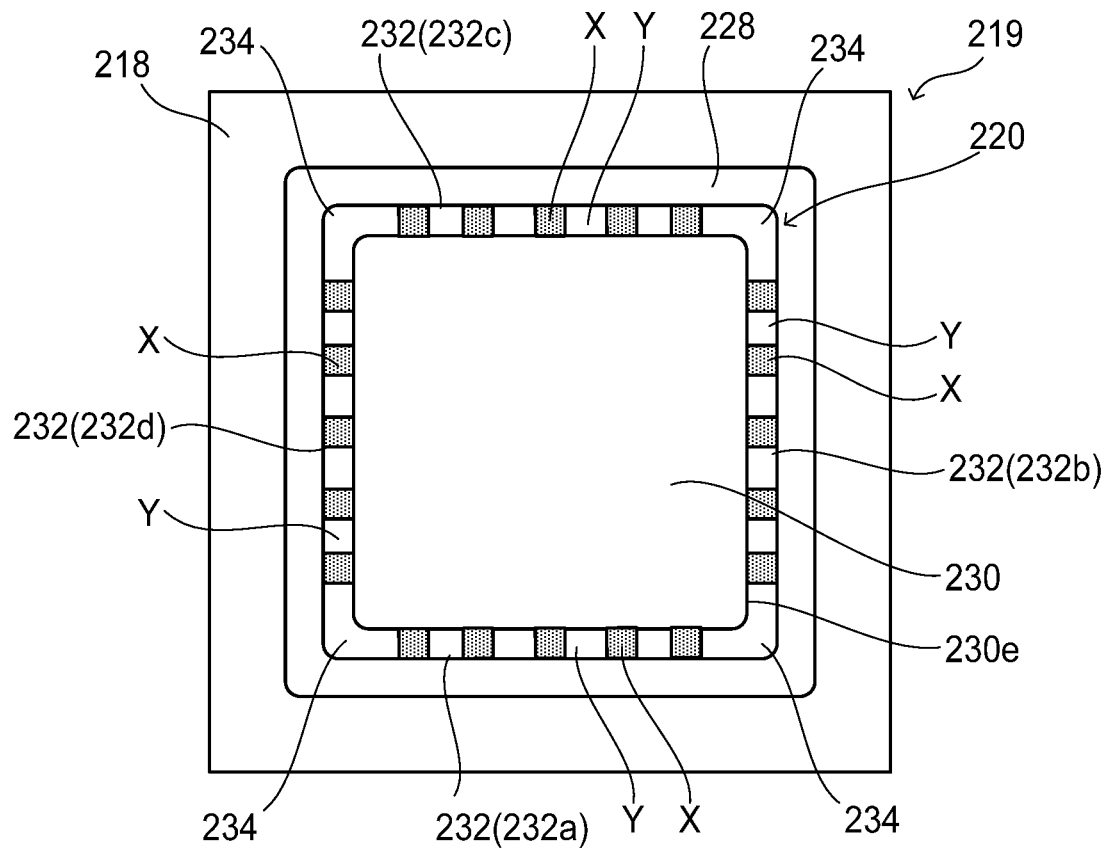
FIG. 17 shows a variant of the semiconductor device 210 of the third embodiment.

In an example shown in FIG. 17, a plurality of the roughened areas X is provided on each of the four flat surfaces 232a to 232d of the side surfaces 232. In a case where the side surfaces 232 include the plurality of flat surfaces 232a to 232d, the plurality of roughened areas X may be provided on at least one of the plurality of flat surfaces 232a to 232d. In the example shown in FIG. 17, the pluralities of the roughened areas X are provided along the peripheral edge 230e of the joint surface 230. Further, between an arbitrary pair of the roughened areas X, the unroughened area Y extends from the peripheral edge 230e of the joint surface 230 to the groove 228. Some variants of the semiconductor device 210 of the third embodiment have been described above, however, the configurations shown in FIGS. 13 to 17 can similarly be employed in the semiconductor devices 10, 110 of other embodiments as well.

Figure 18:
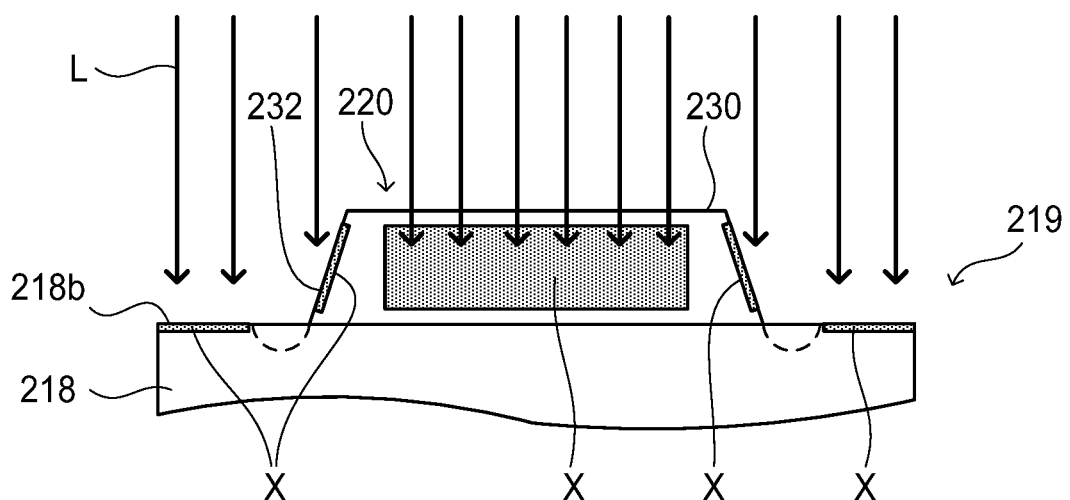
FIG. 18 shows how roughened areas X are formed by laser irradiation in the semiconductor device 210 of the third embodiment.

As aforementioned, in the semiconductor devices 10, 110, 210 of the respective embodiments, the roughened areas X are formed by the laser irradiation. In regard to this point, it is advantageous when the side surfaces 232 where the roughened areas X are to be formed are sloped as in the semiconductor device 210 of the third embodiment. That is, as shown in FIG. 18, when the side surfaces 232 are sloped, laser L can be irradiated from a same direction to all of the flat surfaces 232a to 232d facing different directions. In doing so, a roughened area X may be provided on the lower surface 218b of the plate-shaped portion 218 by irradiating the laser L from the same direction. However, the method of forming the roughened areas X is not limited to the laser irradiation, and other known methods may suitably be employed. For example, the side surfaces 232 may be mechanically or chemically processed, and the surface roughness may be increased by forming coating films on the side surfaces 232.

Figure 19:
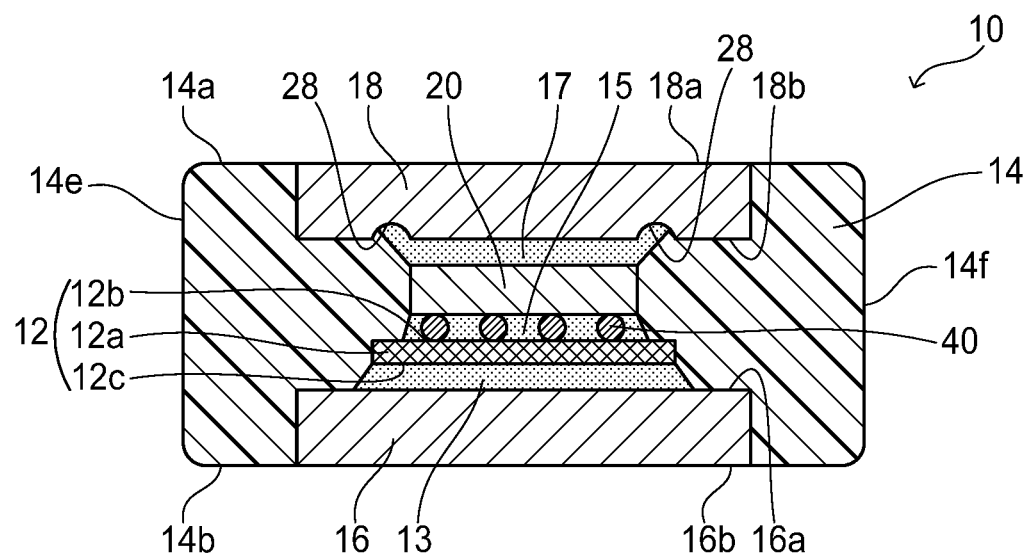
FIG. 19 shows a variant of the semiconductor device 10 of the first embodiment.

In the semiconductor devices 10, 110, 210 of the respective embodiments as aforementioned, granules may be contained in the solder layers 13, 15, 17 to adjust thicknesses of the solder layers 13, 15, 17. In this case, the granules may be constituted of a metal having a higher melting point than solder such as nickel, or other conductor having such a characteristic. A representative example is shown in FIG. 19. In the example shown in FIG. 19, a plurality of granules 40 constituted of nickel is contained in the solder layer 15 between the semiconductor chip 12 and the conductor spacer 20 in the semiconductor device 10 of the first embodiment. Such a configuration may suitably be employed as needed in the semiconductor devices 110, 210 of other embodiments as well.

Figure 20:
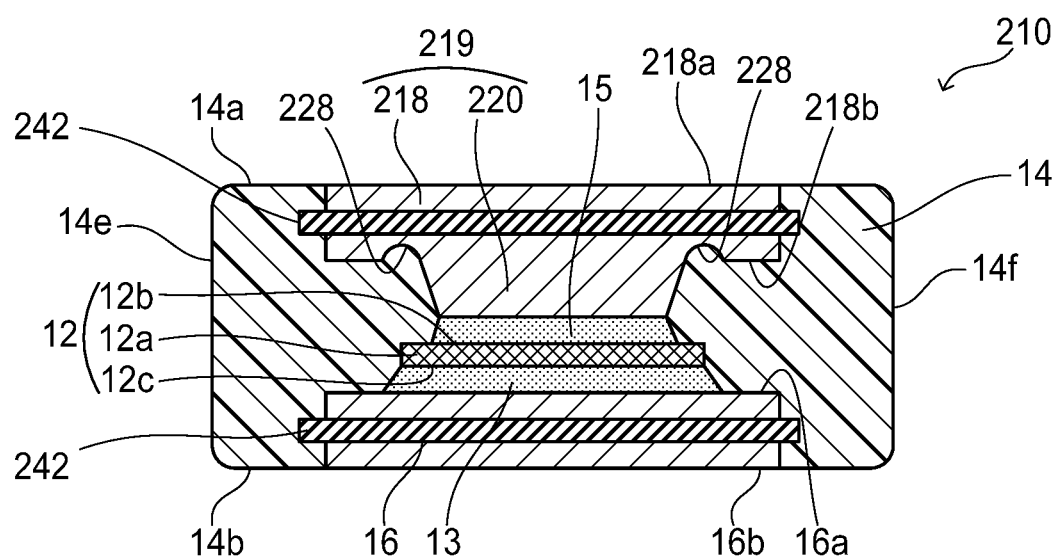
FIG. 20 shows a variant of the semiconductor device 210 of the third embodiment, in which multilayer substrates are employed as a first conductor plate 16 and a second conductor plate 219.
Figure 21:
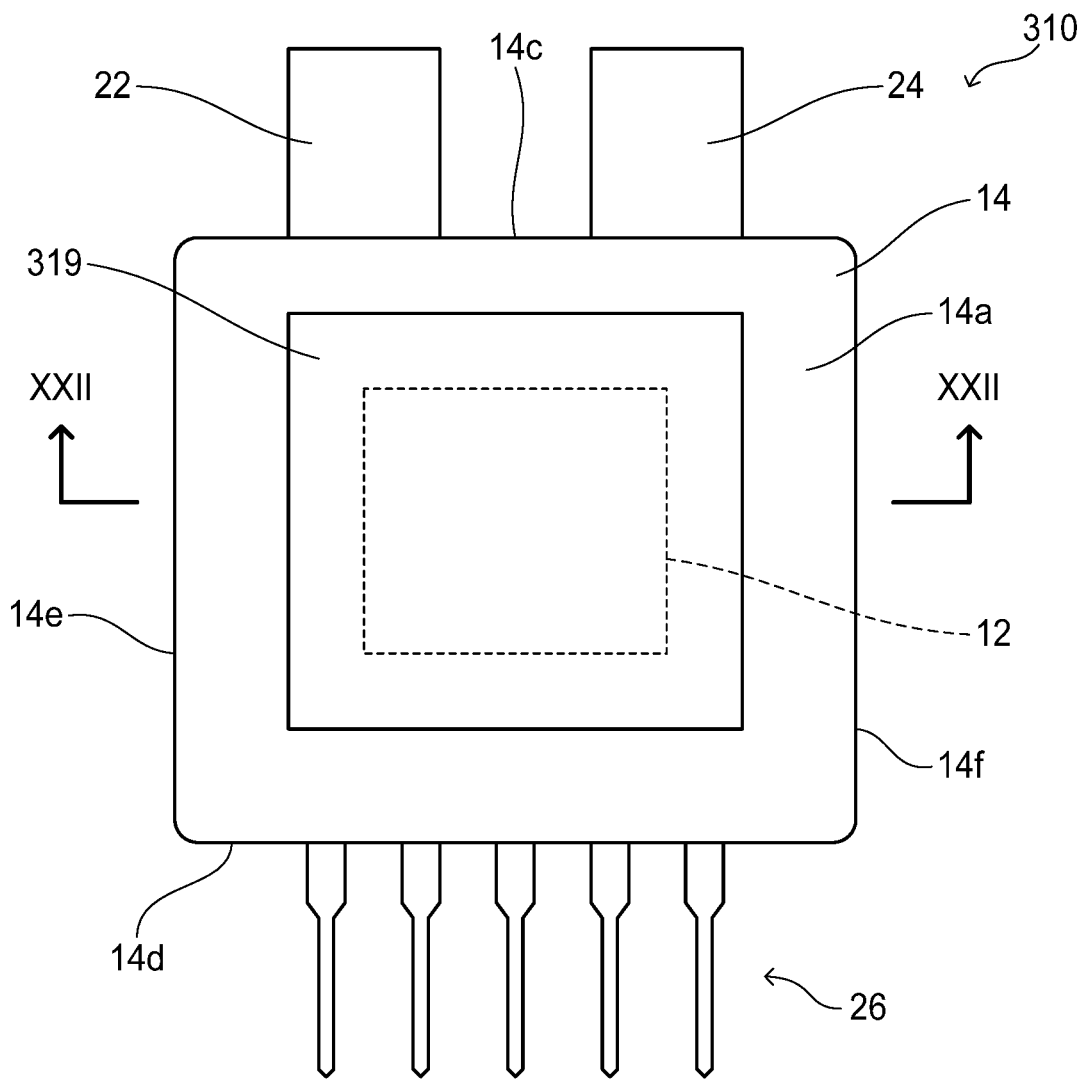
FIG. 21 is a plan view showing an outer appearance of a semiconductor device 310 of a reference example 1.
Figure 22:
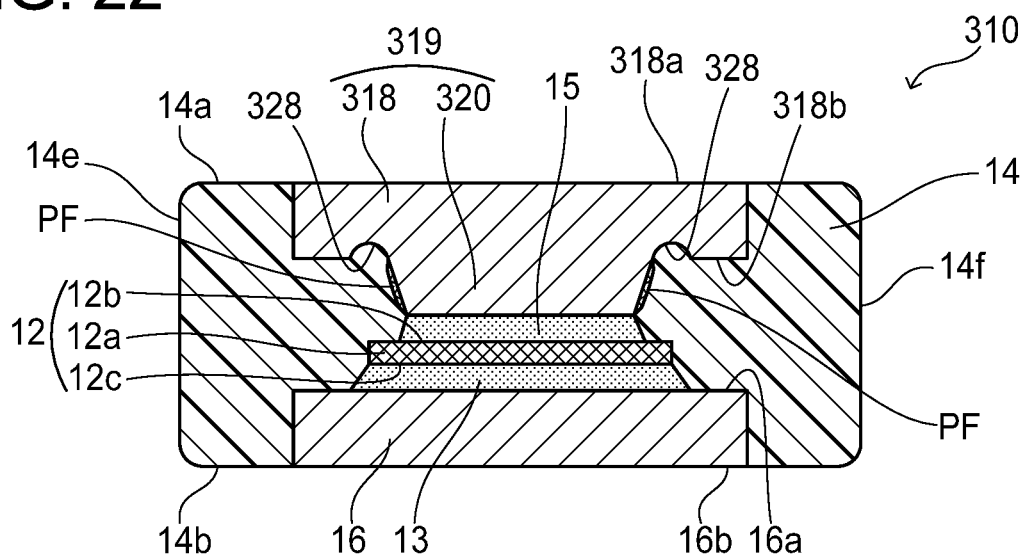
FIG. 22 is a cross-sectional view along a line XXII-XXII in FIG. 21.

In the semiconductor devices 10, 110, 210 of the respective embodiments as aforementioned, one of or both of the first conductor plate 16 and the second conductor plates 18, 119, 219 may be multilayer substrates in each of which a conductor plate is joined to an insulating substrate (such as a ceramic substrate). In this case, the multilayer substrates may for example be DBC (Direct Bonded Copper) substrates or DBA (Direct Bonded Aluminum) or AMC (Active Metal brazed Copper) substrates. A representative example is shown in FIG. 20. In the example shown in FIG. 20, multilayer substrates including ceramic substrates 242 are employed in the first conductor plate 16 and the second conductor plate 219 in the semiconductor device 210 of the third embodiment. According to such a configuration, thermal deformation of the first conductor plate 16 and the second conductor plate 219 is suppressed, and stress generated within the semiconductor device 10 is decreased, by which durability of the semiconductor device 10 is improved, for example.

Reference Example 1

A semiconductor device 310 of a reference example 1 will be described with reference to FIGS. 21 to 24. The semiconductor device 310 of the present reference example has a different configuration of side surfaces 332 of a protruding portion 320 of a second conductor plate 319 as compared to the semiconductor device 210 of the third embodiment. More specifically, in the semiconductor device 310 of the present reference example, a porous film PF is provided on the side surfaces 332 of the protruding portion 320 instead of the roughened areas X and the unroughened areas Y. On the other hand, other configurations of the semiconductor device 310 of the present reference example are same as those of the semiconductor device 210 of the third embodiment. In FIGS. 21 to 24, same reference signs as the semiconductor device 210 of the third embodiment are given to the configurations that are same as those of the semiconductor device 210 of the third embodiment, and redundant explanations therefor will be omitted.

Figure 23:
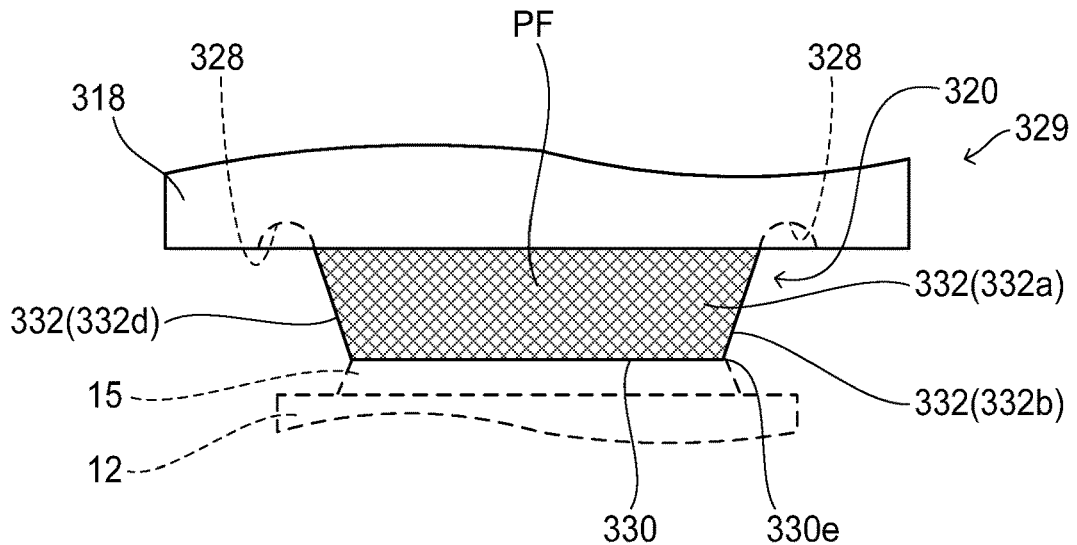
FIG. 23 shows a side surface 332 of a protruding portion 320 of a second conductor plate 319 of the reference example 1.
Figure 24:
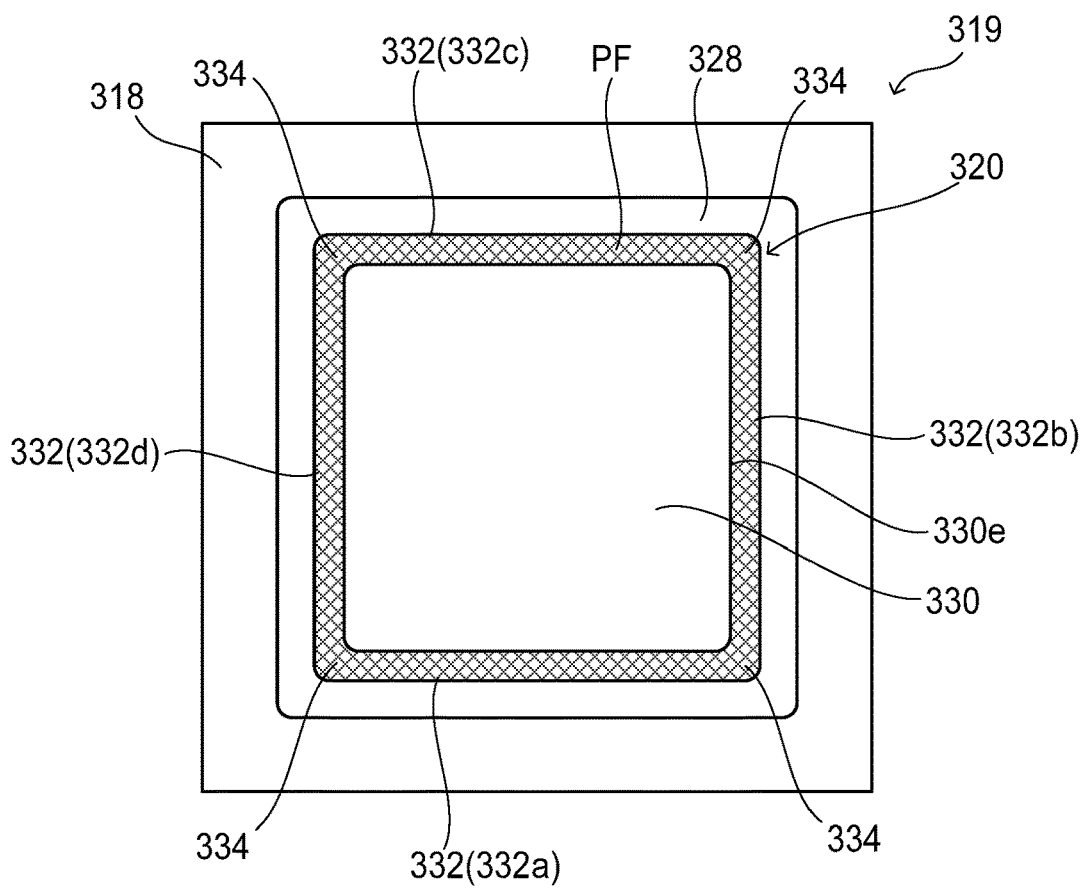
FIG. 24 shows a joint surface 330 of the protruding portion 320 of the second conductor plate 319 of the reference example 1.
Figure 25:
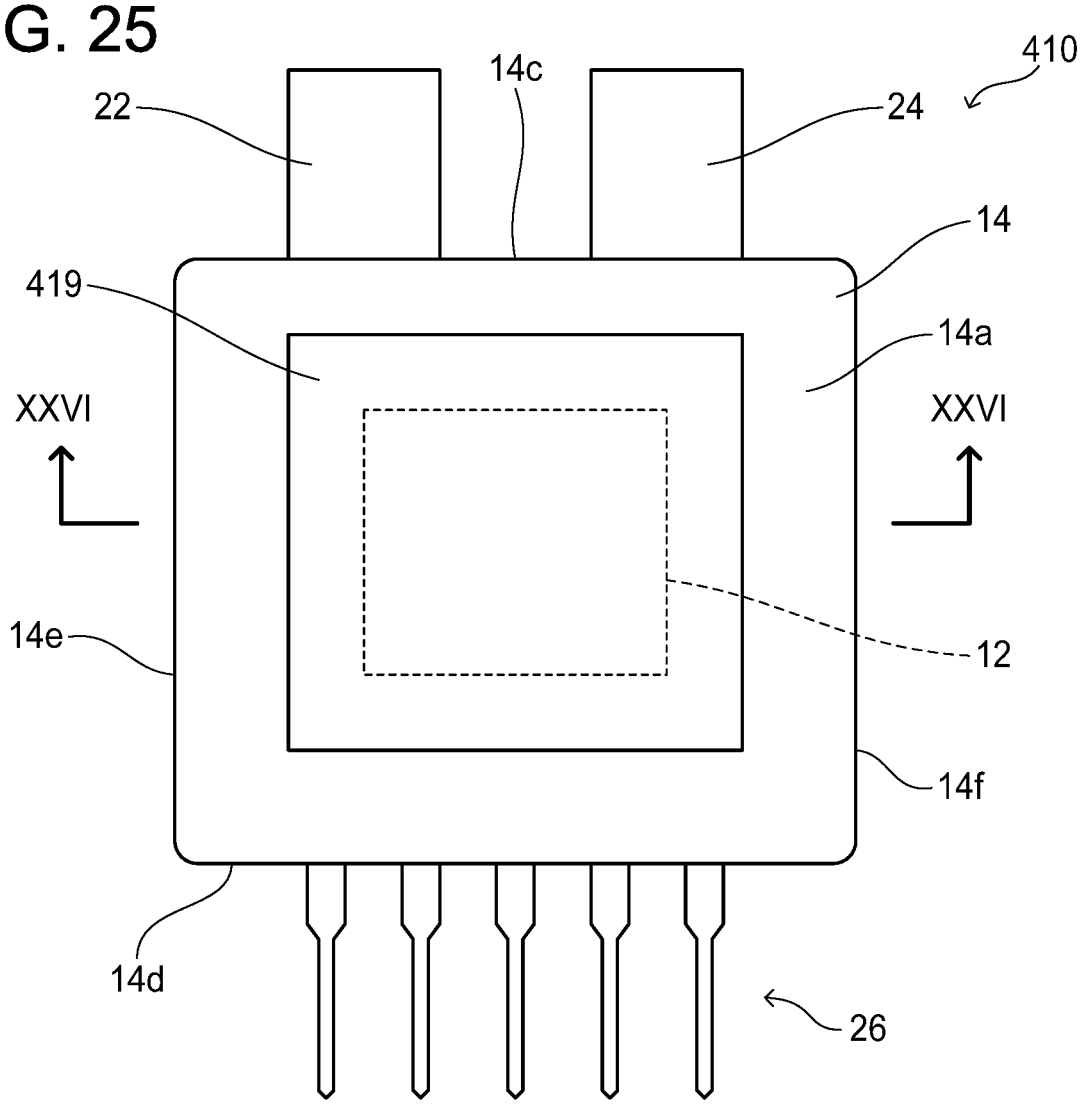
FIG. 25 is a plan view showing an outer appearance of a semiconductor device 410 of a reference example 2.
Figure 26:
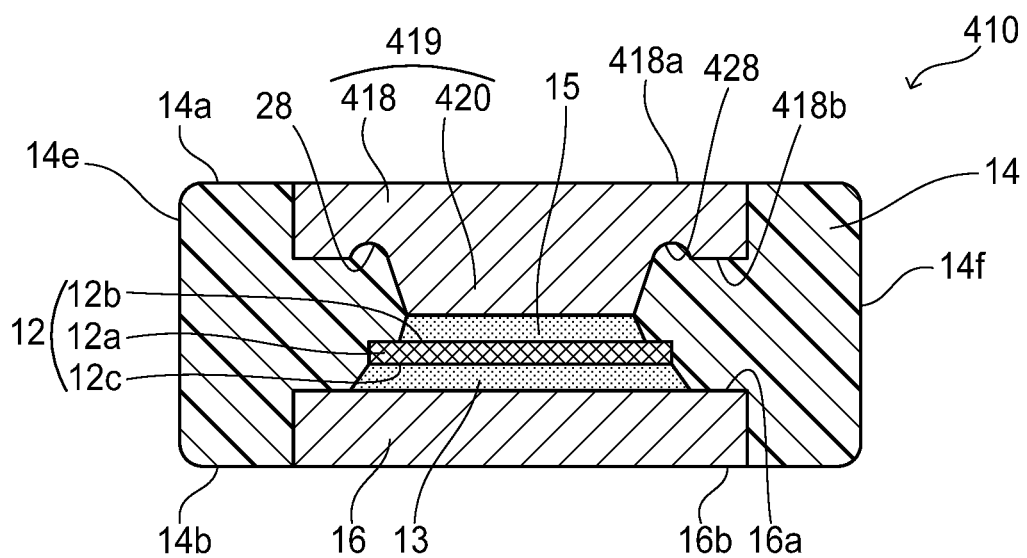
FIG. 26 is a cross-sectional view along a line XXVI-XXVI in FIG. 25.

As shown in FIGS. 23 and 24, the second conductor plate 319 includes a plate-shaped portion 318 and the protruding portion 320. The second conductor plate 319 has a substantially same or similar shape as the plate-shaped portion 218 of the second conductor plate 219 of the third embodiment. A groove 328 is provided in a lower surface 318b of the plate-shaped portion 318 along the protruding portion 320. The protruding portion 320 is electrically connected to the upper surface electrode 12b of the semiconductor chip 12. The protruding portion 320 and the upper surface electrode 12b of the semiconductor chip 12 are joined by soldering, and the solder layer 15 is provided therebetween. Although not particularly limited, the second conductor plate 319 of the present reference example is also constituted of copper and has a nickel plating coating its surface.

The protruding portion 320 of the second conductor plate 319 includes a joint surface 330 in contact with the solder layer 15, and the side surfaces 332 that extend from a peripheral edge 330e of the joint surface 330. The protruding portion 320 has a truncated frustum shape, and the side surfaces 332 thereof slope outwardly in a direction separating away from the joint surface 330. Especially, the protruding portion 320 of the present reference example has a truncated square frustum shape, and the side surfaces 332 of the protruding portion 320 include four flat surfaces 332a, 332b, 332c, 332d and four corners 334. The shape of the protruding portion 320 is not particularly limited, and it may be modified in various ways.

The side surfaces 332 are provided with the porous film PF. Although not particularly limited, the porous film PF in the present reference example is provided over an entirety of the side surfaces 332. That is, the porous film PF is provided on all of the four flat surfaces 332a, 332b, 332c, 332d and the four corners 334. Further, the porous film PF is provided over a region from the peripheral edge 330e of the joint surface 330 to the groove 328. However, as another embodiment, the porous film PF may simply be provided on at least a part of the side surfaces 332. In this case, the porous film PF may for example be provided on at least one of the four flat surfaces 332a to 332d. Further, each of one or more of the flat surfaces 32a to 32d, the porous film PF may be provided partially.

The porous film PF may be formed by a cold spraying method, for example. That is, the porous film PF may be formed by jetting powder of a material for forming the porous film PF onto the side surfaces 332 at a temperature lower than a melting point of this material. Although this is merely an example, the porous film PF of the present reference example is constituted of nickel, similar to a plating layer provided on the side surfaces 332. When the plating layer constituted of the same material is present as a base of the porous film PF, the porous film PF with superior strength can be formed. The porous film PF may be formed by other methods such as sintering, without being limited to the cold spraying method.

As above, the semiconductor device 310 of the present reference example comprises the semiconductor chip 12, the encapsulant 14 that encapsulates the semiconductor chip 12, and the second conductor plate 319 (an example of a conductor member) joined to the semiconductor chip 12 within the encapsulant 14 via the solder layer. The second conductor plate 319 includes the joint surface 330 in contact with the solder layer 15, and the side surfaces 332 extending from the peripheral edge 330e of the joint surface 330. Further, the porous film PF is provided on at least a part of the side surfaces 332.

With the aforementioned configuration, when the semiconductor device 310 is to be manufactured, the protruding portion 320 of the second conductor plate 319 and the semiconductor chip 12 need to be soldered together. In this soldering, excessive solder may overflow from between the semiconductor chip 12 and the protruding portion 320. In this case, if the excessive solder spreads toward the semiconductor chip 12, there is a risk that short circuiting and insufficient insulation occur in the semiconductor chip 12. Contrary to this, if the excessive solder spreads over the side surfaces 332 of the protruding portion 320, the short circuiting and insufficient insulation in the semiconductor chip 12 can be avoided. Due to this, in conventional techniques, expensive gold plating was carried out on the side surfaces 332 of the protruding portion 320 to increase solder wettability.

Contrary to this, in the semiconductor device 310 of the present reference example, the porous film PF is provided on the side surfaces 332 of the protruding portion 320. The porous film PF is capable of absorbing melted solder by capillarity due to its structural characteristic. As such, the excessive solder is easily absorbed by the porous film PF and is suppressed from spreading toward the semiconductor chip 12. The porous film PF can be constituted of a material cheaper than gold, such as nickel. Due to this, durability of the semiconductor device 310 can be improved while suppressing manufacturing cost thereof.

Although not particularly limited, the porous film PF in the present reference example extends from the joint surface 330 to the groove 328. Due to this, the solder having overflowed from the joint surface 330 is smoothly guided to the groove 328 over the porous film PF of the side surfaces 332. With the excessive solder being received by the groove 328, excessive spreading of the solder is suppressed on the lower surface 318b of the plate-shaped portion 318 as well. In addition, with the encapsulant 14 biting into the porous film PF, the side surface 332 of the protruding portion 320 and the encapsulant 14 are firmly adhered to each other. Due to this, sealability of the semiconductor chip 12 by the encapsulant 14 can also be increased.

Reference Example 2

A semiconductor device 410 of a reference example 2 will be described with reference to FIGS. 25 to 28. The semiconductor device 410 of the present reference example has a different configuration of side surfaces 432 of a protruding portion 420 of a second conductor plate 419 as compared to the semiconductor device 210 of the third embodiment. More specifically, in the semiconductor device 410 of the present reference example, a plurality of guiding grooves GG is provided on the side surfaces 432 of the protruding portion 420 instead of the roughened areas X and the unroughened areas Y. On the other hand, other configurations of the semiconductor device 410 of the present reference example are same as those of the semiconductor device 210 of the third embodiment. In FIGS. 25 to 28, same reference signs as the semiconductor device 210 of the third embodiment are given to the configurations that are same as those of the semiconductor device 210 of the third embodiment, and redundant explanations therefor will be omitted.

Figure 27:
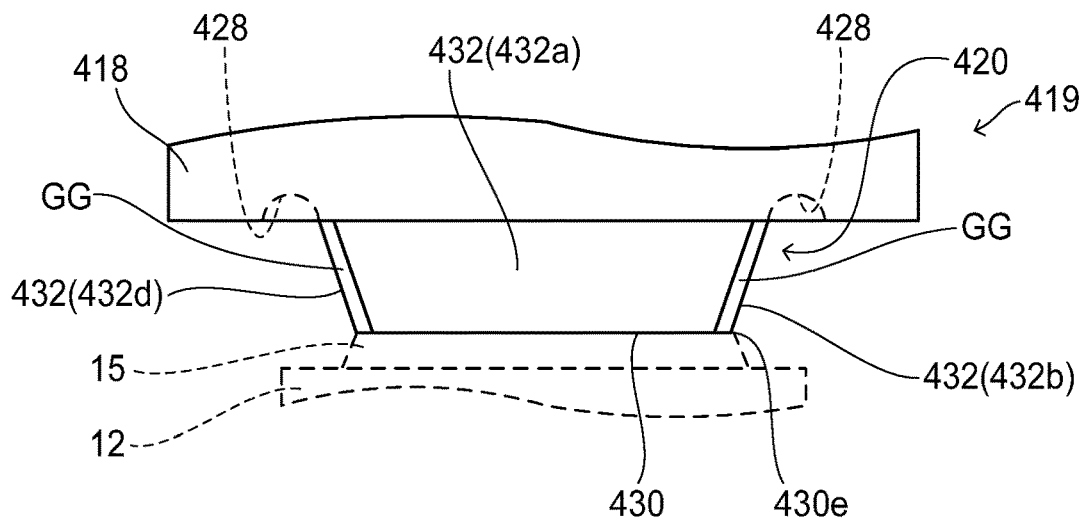
FIG. 27 shows a side surface 432 of a protruding portion 420 of a second conductor plate 419 of the reference example 2.
Figure 28:
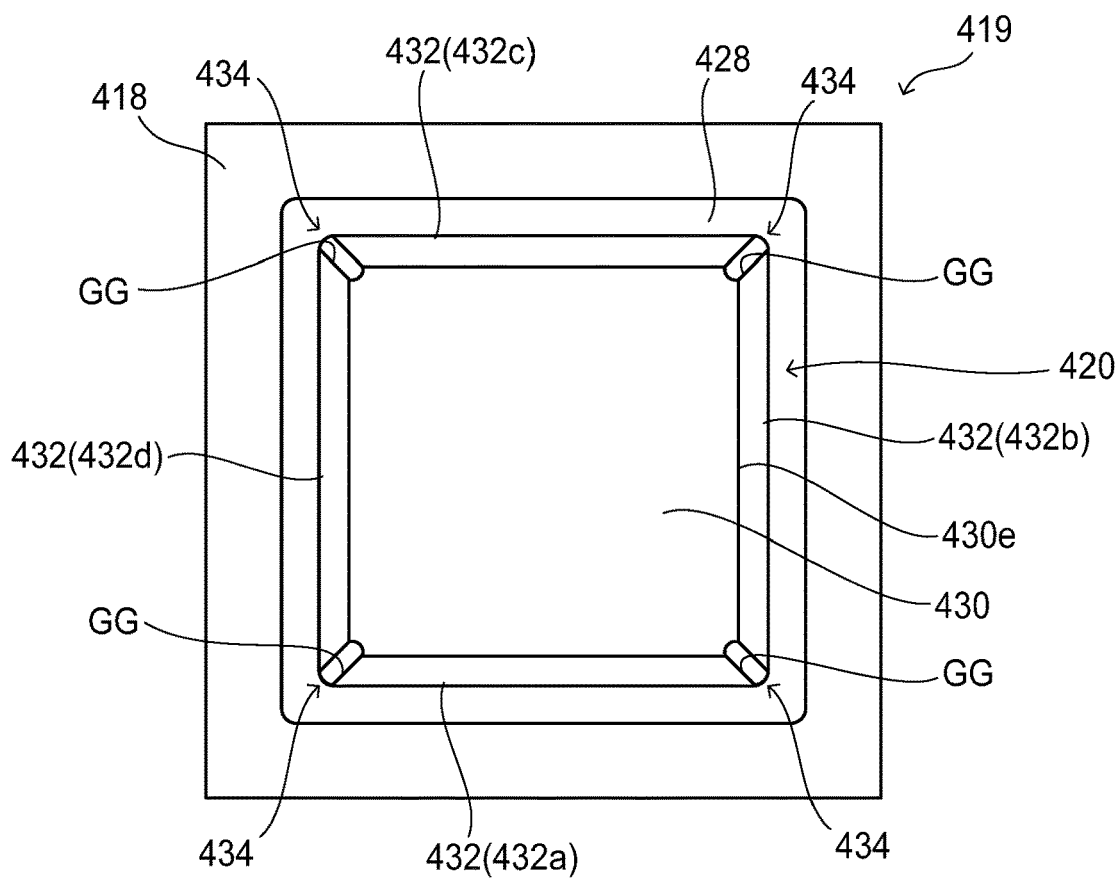
FIG. 28 shows a joint surface 430 of the protruding portion 420 of the second conductor plate 419 of the reference example 2.

As shown in FIGS. 27 and 28, the second conductor plate 419 includes a plate-shaped portion 418 and the protruding portion 420. The second conductor plate 419 has a substantially same or similar shape as the plate-shaped portion 218 of the second conductor plate 219 of the third embodiment. A groove 428 is provided in a lower surface 418b of the plate-shaped portion 418 along the protruding portion 420. Hereinbelow, this groove 428 will be termed a circumferential groove 428 to distinguish it from the guiding grooves GG. The protruding portion 420 is electrically connected to the upper surface electrode 12b of the semiconductor chip 12. The protruding portion 420 and the upper surface electrode 12b of the semiconductor chip 12 are joined by soldering, and the solder layer 15 is provided therebetween. Although not particularly limited, the second conductor plate 419 of the present reference example is also constituted of copper and has a nickel plating coating its surface.

The protruding portion 420 of the second conductor plate 419 includes a joint surface 430 in contact with the solder layer 15, and the side surfaces 432 that extend from a peripheral edge 430e of the joint surface 430. The protruding portion 420 has a truncated frustum shape, and the side surfaces 432 thereof slope outwardly in a direction separating away from the joint surface 430. Especially, the protruding portion 420 of the present reference example has a truncated square frustum shape, and the side surfaces 432 of the protruding portion 420 include four flat surfaces 432a, 432b, 432c, 432d and four corners 434. The shape of the protruding portion 420 is not particularly limited, and it may be modified in various ways.

The side surfaces 432 of the protruding portion 420 are provided with the plurality of guiding grooves GG. Although not particularly limited, in the present reference example, each of four guiding grooves GG is provided at its corresponding one of the four corners 434. Each of the guiding grooves GG extends along its corresponding corner 434 from the peripheral edge 430e of the joint surface 430 to the circumferential groove 428. Due to this, the four guiding grooves GG are arranged symmetrically relative to the joint surface 430. A number, positions, and shapes of the guiding grooves GG are not particularly limited. As another embodiment, at least one guiding groove GG may simply be provided on the side surfaces 432 of the protruding portion 420. Further, the guiding grooves GG are not limited to being provided at the corners 434 of the side surfaces 432, but may be provided on the flat surfaces 432a to 432d of the side surfaces 432. Further, a width and/or depth of each of the guiding grooves GG may be constant, or may change continuously or in steps along its longitudinal direction.

As above, the semiconductor device 410 of the present reference example comprises the semiconductor chip 12, the encapsulant 14 that encapsulates the semiconductor chip 12, and the conductor plate 419 joined to the semiconductor chip 12 within the encapsulant 14 via the solder layer 15. The conductor plate 419 includes the plate-shaped portion 418 and the protruding portion 420 protruding from the lower surface 418b of the plate-shaped portion 418. The protruding portion 420 includes the joint surface 430 in contact with the solder layer 15, and the side surfaces 432 extending from the peripheral edge 430e of the joint surface 430. The circumferential groove 428 extending along the peripheral edge of the protruding portion 420 is provided on the lower surface 418b of the plate-shaped portion 418. Further, the guiding grooves GG extending from the peripheral edge 430e of the joint surface 430 to the circumferential groove 428 are provided on the side surfaces 432 of the protruding portion 420.

According to the above configuration, when the semiconductor device 410 is to be manufactured, the protruding portion 420 of the second conductor plate 419 and the semiconductor chip 12 need to be soldered together. In this soldering, excessive solder may overflow from between the semiconductor chip 12 and the protruding portion 420. In this case, if the excessive solder spreads toward the semiconductor chip 12, there is a risk that short circuiting and insufficient insulation occur in the semiconductor chip 12. Contrary to this, if the excessive solder spreads over the side surfaces 432 of the protruding portion 420, the short circuiting and insufficient insulation in the semiconductor chip 12 can be avoided. Due to this, in the conventional techniques, expensive gold plating was carried out on the side surfaces 432 of the protruding portion 420 to increase the solder wettability. However, if the side surfaces 432 of the protruding portion 420 are broadly covered by the solder, an adhering degree between these side surfaces 432 and the encapsulant 14 may decrease, by which durability of the semiconductor device 410 may be degraded, for example.

Contrary to this, in the semiconductor device 410 of the present reference example, the guiding grooves GG are provided on the side surfaces 432 of the protruding portion 420. A cross-sectional area of each of the guiding grooves GG is sufficiently small, and the melted solder spreads within the guiding grooves GG. As such, the excessive solder is guided to the circumferential groove 428 through the guiding grooves GG and is suppressed from spreading toward the semiconductor chip 12. Further, with the excessive solder being collected in the guiding grooves GG, the side surfaces 432 of the protruding portion 420 is suppressed from being broadly covered by the solder. Due to this, the adhering degree between the side surfaces 432 of the protruding portion 420 and the encapsulant 14 is maintained, and the durability of the semiconductor device 410 is evidently improved. Further, formation of the guiding grooves GG may be carried out for example by stamping, and such can be carried out at lower cost than gold plating. Due to this, product quality of the semiconductor device 410 can be improved while suppressing manufacturing cost thereof.

What is claimed is:

1. A semiconductor device comprising:
   a semiconductor chip;
   an encapsulant encapsulating the semiconductor chip therein; and
   a conductor member joined to the semiconductor chip via a solder layer within the encapsulant;
   wherein
   the conductor member comprises a joint surface being in contact with the solder layer and a side surface extending from a peripheral edge of the joint surface,
   the side surface comprises a plurality of flat surfaces located along the peripheral edge of the joint surface and a plurality of corners each located between a corresponding pair of adjacent flat surfaces of the plurality of flat surfaces,
   at least two of the plurality of flat surfaces each comprises an unroughened area and a roughened area that is greater in surface roughness than the unroughened area,
   the unroughened area is located adjacent to the peripheral edge of the joint surface, and
   all parts of the roughened area are located apart from each of the corners.

2. The semiconductor device according to claim 1, wherein the roughened area is located apart from the peripheral edge of the joint surface.

3. The semiconductor device according to claim 1, wherein
   the conductor member comprises a plate-shaped portion and a protruding portion protruding from a surface of the plate-shaped portion, and
   the joint surface and the side surface are located on the protruding portion.

4. The semiconductor device according to claim 3, wherein
   the surface of the plate-shaped portion comprises a groove extending around the protruding portion, and
   the unroughened area extends from the peripheral edge of the joint surface to the groove.

5. The semiconductor device according to claim 1, wherein the side surface slopes outwardly in a direction separating away from the joint surface.

6. The semiconductor device according to claim 1, wherein all of the plurality of flat surfaces each comprises the roughened area.

7. The semiconductor device according to claim 1, wherein
   the roughened area includes two or more roughened areas, and
   at least one of the plurality of flat surfaces comprises at least two of the two or more roughened areas.

* * * * *